United States Patent
Nishigori et al.

(10) Patent No.: US 12,176,927 B2
(45) Date of Patent: Dec. 24, 2024

(54) DECODING APPARATUS, DECODING METHOD, AND PROGRAM

(71) Applicant: Sony Corporation, Tokyo (JP)

(72) Inventors: Shuichiro Nishigori, Tokyo (JP); Shiro Suzuki, Kanagawa (JP); Hirofumi Takeda, Kanagawa (JP); Jun Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 17/254,792

(22) PCT Filed: Apr. 25, 2019

(86) PCT No.: PCT/JP2019/017709
§ 371 (c)(1),
(2) Date: Dec. 21, 2020

(87) PCT Pub. No.: WO2020/003727
PCT Pub. Date: Jan. 2, 2020

(65) Prior Publication Data
US 2021/0266010 A1    Aug. 26, 2021

(30) Foreign Application Priority Data
Jun. 28, 2018    (JP) .................. 2018-122962

(51) Int. Cl.
| | |
|---|---|
| *H03M 7/00* | (2006.01) |
| *G06F 3/01* | (2006.01) |
| *H03M 7/30* | (2006.01) |

(52) U.S. Cl.
CPC ......... *H03M 7/3062* (2013.01); *G06F 3/016* (2013.01); *H03M 7/6005* (2013.01); *H03M 7/6011* (2013.01)

(58) Field of Classification Search
CPC ............ H03M 7/3062; H03M 7/6005; H03M 7/6011; H03M 7/70; H03M 7/30; H03M 7/40; G06F 3/016; G06F 3/014
(Continued)

(56) References Cited

U.S. PATENT DOCUMENTS

| | | | |
|---|---|---|---|
| 5,855,553 A | 1/1999 | Tajima et al. | |
| 5,859,826 A * | 1/1999 | Ueno ................ | H04H 20/88 369/47.2 |

(Continued)

FOREIGN PATENT DOCUMENTS

| | | |
|---|---|---|
| CN | 1639984 A | 7/2005 |
| CN | 101996413 A | 3/2011 |

(Continued)

OTHER PUBLICATIONS

International Search Report and English translation thereof dated Jul. 16, 2019 in connection with International Application No. PCT/JP2019/017709.

(Continued)

*Primary Examiner* — Jean B Jeanglaude
(74) *Attorney, Agent, or Firm* — Wolf, Greenfield & Sacks, P.C.

(57) ABSTRACT

A tactile reproduction system achieves a data amount reduction of a tactile signal while ensuring reproducibility of a tactile sense. A decoding apparatus includes a decoding unit configured to decode tactile coded data obtained by performing encoding of compressing an information amount, on a tactile signal using higher-order perception in a tactile sense. Therefore, a data amount reduction of a tactile signal can be performed in accordance with a tactile characteristic of a human.

12 Claims, 20 Drawing Sheets

(58) Field of Classification Search
USPC .......................................................... 341/50
See application file for complete search history.

(56) References Cited

U.S. PATENT DOCUMENTS

| | | | |
|---|---|---|---|
| 8,107,527 | B1 | 1/2012 | Hobbs et al. |
| 9,264,094 | B2 * | 2/2016 | Daimou ................. H04B 1/667 |
| 9,626,845 | B2 * | 4/2017 | Eagleman ................ G08B 6/00 |
| 10,857,358 | B2 | 12/2020 | Bouton et al. |
| 11,095,894 | B2 * | 8/2021 | Jeon ..................... H04N 19/184 |
| 11,823,557 | B2 | 11/2023 | Suzuki et al. |
| 11,922,797 | B2 | 3/2024 | Takeda et al. |
| 2003/0227374 | A1 | 12/2003 | Ling |
| 2008/0082321 | A1 | 4/2008 | Ide |
| 2009/0066725 | A1 | 3/2009 | Nogami et al. |
| 2013/0039412 | A1 * | 2/2013 | Narroschke .......... H04N 19/107 |
| | | | 375/240.03 |
| 2014/0074696 | A1 | 3/2014 | Glaser |
| 2014/0122065 | A1 * | 5/2014 | Daimou ................. H04B 1/667 |
| | | | 704/205 |
| 2015/0070261 | A1 | 3/2015 | Saboune et al. |
| 2015/0241973 | A1 | 8/2015 | Luden |
| 2016/0012688 | A1 * | 1/2016 | Eagleman ............... G06F 3/016 |
| | | | 340/407.1 |
| 2016/0055726 | A1 | 2/2016 | Aldossary |
| 2016/0310844 | A1 * | 10/2016 | Yamashita ............ A63F 13/285 |
| 2016/0337734 | A1 | 11/2016 | Efrati |
| 2018/0091575 | A1 | 3/2018 | Toba et al. |
| 2018/0300651 | A1 | 10/2018 | Knott et al. |
| 2020/0145661 | A1 * | 5/2020 | Jeon ..................... H04N 19/136 |
| 2021/0272426 | A1 | 9/2021 | Takeda et al. |
| 2021/0366248 | A1 | 11/2021 | Suzuki et al. |
| 2023/0419795 | A1 | 12/2023 | Suzuki et al. |
| 2024/0030936 | A1 | 1/2024 | Nishigori et al. |

FOREIGN PATENT DOCUMENTS

| | | | |
|---|---|---|---|
| CN | 102971689 | A | 3/2013 |
| CN | 104184721 | A | 12/2014 |
| CN | 104423590 | A | 3/2015 |
| CN | 106210743 | A | 12/2016 |
| CN | 107710107 | A | 2/2018 |
| EP | 0 732 082 | A2 | 9/1996 |
| EP | 1 125 557 | A2 | 8/2001 |
| EP | 2 034 390 | A2 | 3/2009 |
| EP | 2846219 | A1 | 3/2015 |
| JP | H8-215211 | A | 8/1996 |
| JP | 2003-169832 | A | 6/2003 |
| JP | 2009-069918 | A | 4/2009 |
| JP | 2010-029309 | A | 2/2010 |
| JP | 2011-523364 | A | 8/2011 |
| JP | 2013-091114 | A | 5/2013 |
| JP | 2014-239430 | A | 12/2014 |
| JP | 2015-053038 | A | 3/2015 |
| JP | 2015-053044 | A | 3/2015 |
| JP | 2015121918 | A | 7/2015 |
| JP | 2016-202486 | A | 12/2016 |
| JP | 2017221631 | A | 12/2017 |
| JP | 2018-010582 | A | 1/2018 |
| JP | 2018-060313 | A | 4/2018 |
| JP | 2018-097850 | A | 6/2018 |
| JP | 2018-526722 | A | 9/2018 |
| JP | 2019185678 | A | 10/2019 |
| WO | WO 2017/001293 | A1 | 1/2017 |
| WO | WO 2017/175868 | A1 | 10/2017 |
| WO | WO 2018/008217 | A1 | 1/2018 |
| WO | WO 2018/092595 | A1 | 5/2018 |

OTHER PUBLICATIONS

Mizukami et al., Tactile Transmission by Higher-Level Perception Using Vibration of Shape Memory Alloy Thread. IPSJ Journal. Dec. 2007;48(12):3739-49.

International Search Report and English translation thereof dated Jun. 4, 2019 in connection with International Application No. PCT/JP2019/017710.

International Written Opinion and English translation thereof dated Jun. 4, 2019 in connection with International Application No. PCT/JP2019/017710.

International Preliminary Report on Patentability and English translation thereof dated Jan. 7, 2021 in connection with International Application No. PCT/JP2019/017710.

International Written Opinion and English translation thereof dated Jul. 16, 2019 in connection with International Application No. PCT/JP2019/017709.

International Preliminary Report on Patentability and English translation thereof dated Jan. 7, 2021 in connection with International Application No. PCT/JP2019/017709.

International Search Report and English translation thereof dated Jul. 23, 2019 in connection with International Application No. PCT/JP2019/017711.

International Written Opinion and English translation thereof dated Jul. 23, 2019 in connection with International Application No. PCT/JP2019/017711.

International Preliminary Report on Patentability and English translation thereof dated Jan. 14, 2021 in connection with International Application No. PCT/JP2019/017711.

Hoshino et al., Jorro Beat: Improvment of Music Experience in the Bathroom by Shower Tactile Stimulation. The Transactions of Human Interface Society. Dec. 31, 2016;18(2):77-86.

Sakaguchi, Haptic Recognition System Based on Sensory Integration and Active Perception. Transactions of the Society of Instrument and Control Engineers. Aug. 31, 1995;31(8):1217-1226.

U.S. Appl. No. 17/255,537, filed Dec. 23, 2020, Suzuki et al.
U.S. Appl. No. 17/254,566, filed Dec. 21, 2020, Takeda et al.
U.S. Appl. No. 18/464,603, filed Sep. 11, 2022, Suzuki et al.
U.S. Appl. No. 18/481,416, filed Oct. 5, 2023, Nishigori et al.

* cited by examiner

FIG. 11
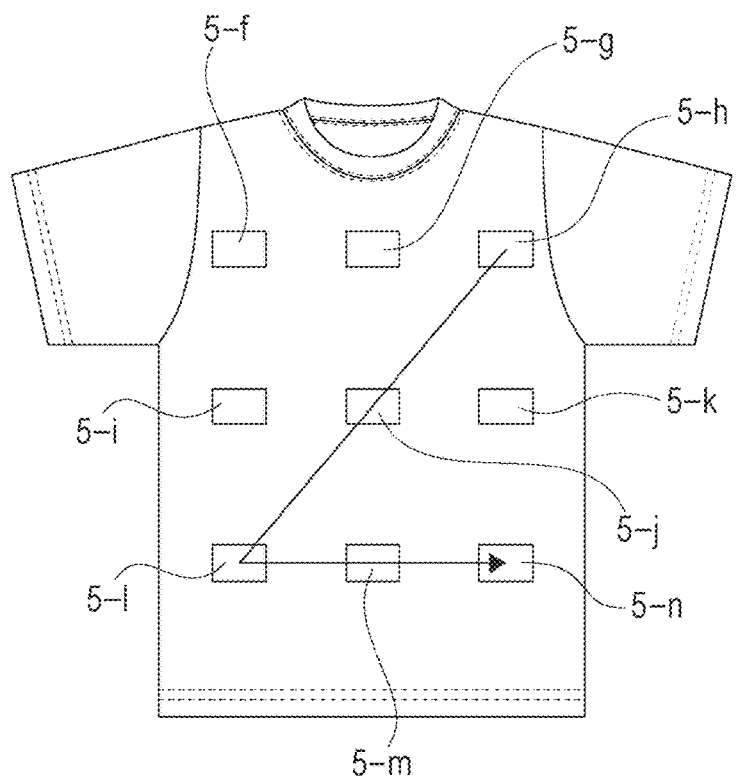
FIG. 12
A
DETECTED SIGNAL
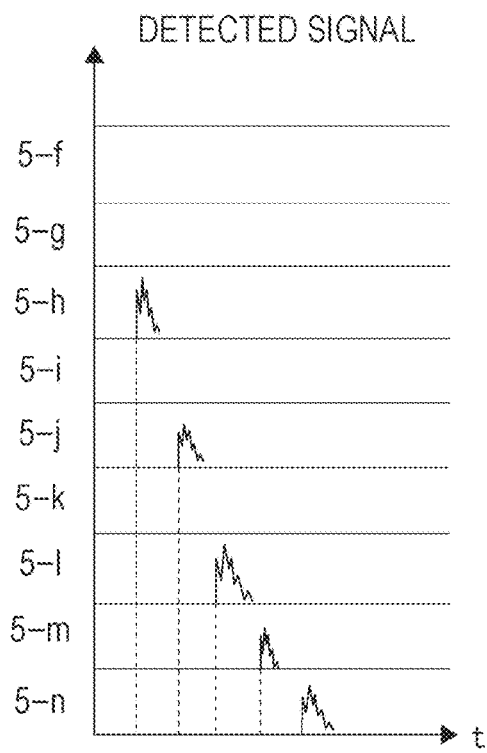
B
RECORDED DATA
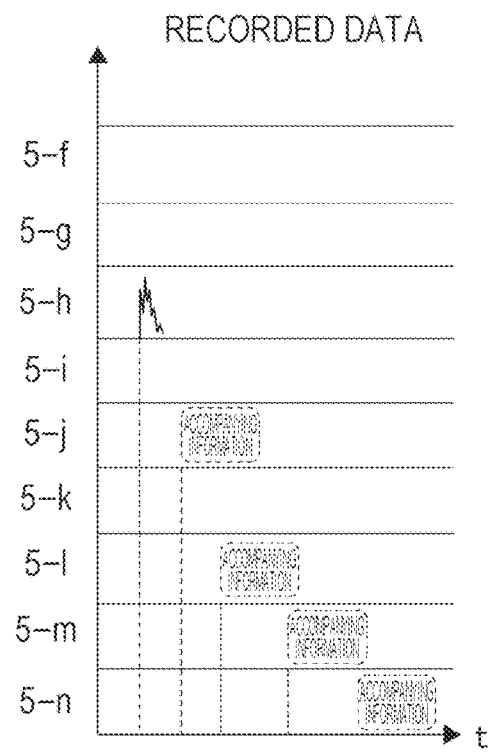

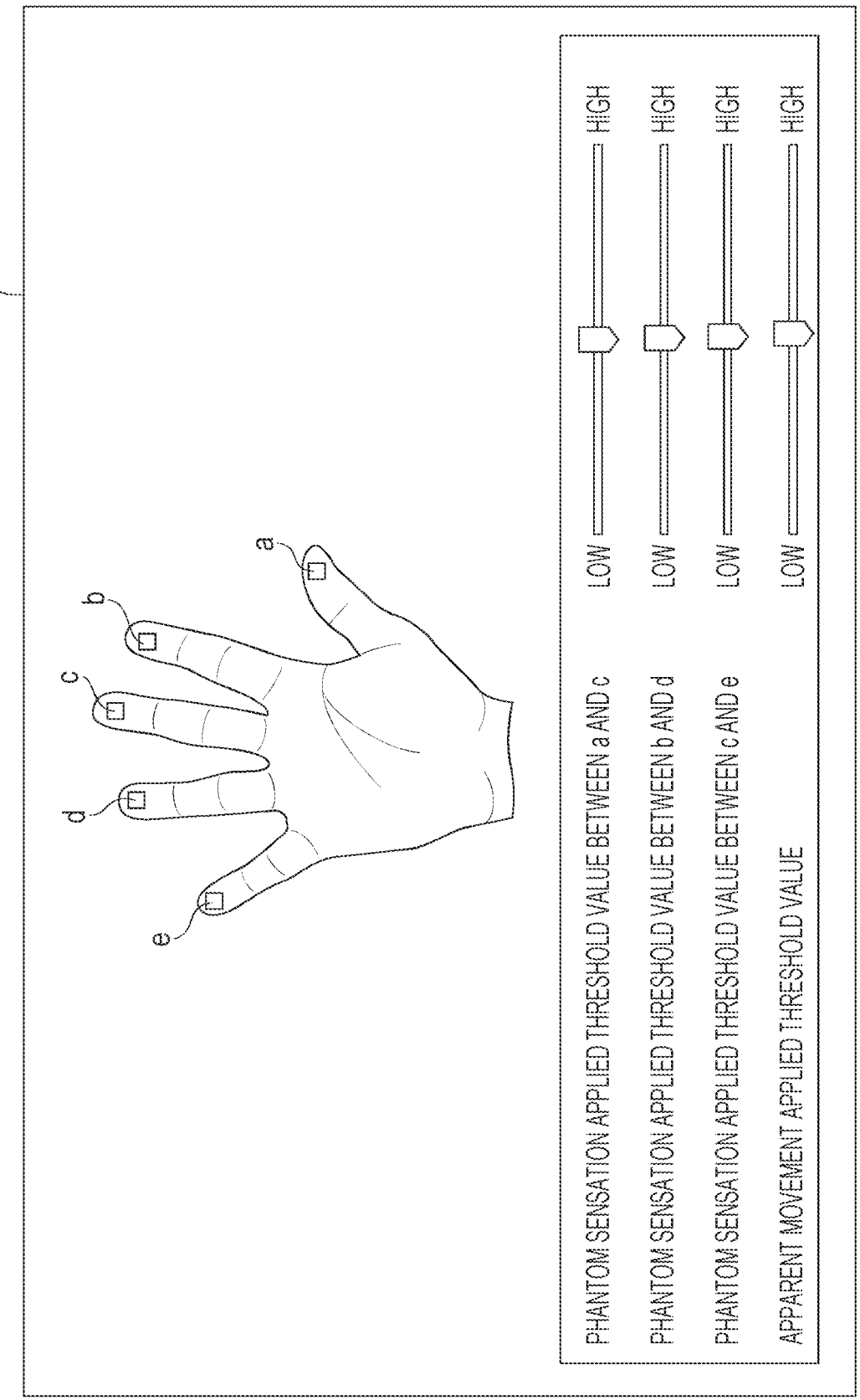

DECODING APPARATUS, DECODING METHOD, AND PROGRAM

CROSS-REFERENCE TO RELATED APPLICATIONS

This application claims the benefit under 35 U.S.C. § 371 as a U.S. National Stage Entry of International Application No. PCT/JP2019/017709, filed in the Japanese Patent Office as a Receiving Office on Apr. 25, 2019, which claims priority to Japanese Patent Application Number JP2018-122962, filed in the Japanese Patent Office on Jun. 28, 2018, each of which is hereby incorporated by reference in its entirety.

TECHNICAL FIELD

The present technology relates to a decoding apparatus that decodes an encoded tactile signal, a method of the same, and a program.

BACKGROUND ART

In recent years, an application that applies tactile stimulation using a tactile presentation device being in contact with the skin of a human has been used in various scenes. Here, the "tactile presentation" means the generation of tactile stimulation.

For example, in a touch panel-equipped mobile terminal such as a smartphone, by applying tactile stimulation to a finger by vibrating a panel (or casing) at the time of a touch operation of the panel, a pseudo touch sense of a button is created.

In music listening, some apparatuses enhance deep bass sound by incorporating a tactile presentation device into a headphone casing, and applying tactile stimulation in synchronization with music reproduction.

In the field of computer games and virtual reality (VR), some apparatuses enhance immersive feeling of a user by interactively applying tactile stimulation in accordance with a scene by a tactile presentation device installed in a controller in accordance with an operation of the user.

In amusement facility, some apparatuses enhance realistic feeling of visitors by applying tactile stimulation using a tactile presentation device installed in a seat in a movie theater, an entertainment park, or the like in accordance with a scene.

Furthermore, as for apparatuses in a research and development phase, in remotely controlling a robot and the like, some apparatuses help hazard anticipation by feeding back a vibration received by the robot or an operated target object, to a controller held by an operator, and causing the operator to intuitively detect a surrounding situation of the robot or the target object (e.g., disaster assistance robot <http://www.rm.is.tohoku.ac.jp/quince_mech/#8>)

Moreover, in the medical field, the research has been conducted for enhancing the accuracy of surgery by feeding back feeling (stiffness) felt when forceps of an endoscope touch an organ at the time of an operation of a surgical robot, to an operator (e.g., surgical support robot "da Vinci surgical system" <http://techon.nikkeibp.co.jp/article/FEATURE/20150217/404460/?P=2>)

Note that the related prior arts include Patent Document 1 described below. Patent Document 1 discloses a technology of generating a tactile signal on the basis of a voice signal, instead of generating a tactile signal indicating a pattern of tactile stimulation by sensing tactile information such as vibration.

CITATION LIST

Patent Document

Patent Document 1: Japanese Patent Application Laid-Open No. 2015-53038

SUMMARY OF THE INVENTION

Problems to be Solved by the Invention

Here, a tactile reproduction system that reproduces tactile information is considered to include a plurality of tactile presentation devices prepared for applying tactile stimulation to a plurality of regions of a human body, communicate a tactile signal in a wired or wireless manner, and perform other operations.

However, in accordance with an increase in the number of regions to which tactile stimulation is applied, the number of channels of tactile signals also increases, and an increase in a data amount is caused. If a data amount of a tactile signal increases, an increase in processing burden related to tactile reproduction, transmission delay, and the like might be caused, which is undesirable.

The present technology has been devised in view of the above-described circumstances, and the object of the present technology is to make a tactile reproduction system more efficient, by achieving a data amount reduction of a tactile signal while ensuring reproducibility of a tactile sense.

Solutions to Problems

A decoding apparatus according to the present technology includes a decoding unit configured to decode tactile coded data obtained by performing encoding of compressing an information amount, on a tactile signal using higher-order perception in a tactile sense.

Therefore, a data amount reduction of a tactile signal can be performed in accordance with a tactile characteristic of a human.

In the above-described decoding apparatus according to the present technology, it is desirable that the decoding unit decodes the tactile coded data having been subjected to encoding of compressing an information amount using phantom sensation.

Therefore, in response to a case where similar tactile stimulation is to be simultaneously applied to three or more regions of a human body, a data amount reduction can be performed in accordance with a tactile characteristic of a human.

In the above-described decoding apparatus according to the present technology, it is desirable that the tactile coded data includes usage channel designation information for designating a usage channel from among three or more channels of tactile signals, and the decoding unit outputs a tactile signal of a channel indicated by the usage channel designation information.

Therefore, in implementing a data amount reduction that uses phantom sensation, the decoding apparatus needs not perform processing such as processing of determining whether or not phantom sensation is used, by analyzing a tactile signal, and is only required to perform simple processing of outputting a tactile signal in accordance with usage channel designation information included in tactile coded data.

In the above-described decoding apparatus according to the present technology, it is desirable that the decoding unit decodes the tactile coded data having been subjected to encoding of compressing an information amount using an apparent movement.

Therefore, in response to a case where similar tactile stimulation is to be sequentially applied to different regions of a human body, a data amount reduction can be performed in accordance with a tactile characteristic of a human.

In the above-described decoding apparatus according to the present technology, it is desirable that the tactile coded data includes usage presence/absence information indicating usage presence/absence of an apparent movement, and the decoding unit decodes the tactile coded data on the basis of the usage presence/absence information.

Therefore, in implementing a data amount reduction that uses an apparent movement, the decoding apparatus needs not perform processing such as processing of determining whether or not an apparent movement is used, by analyzing a tactile signal, and is only required to perform simple processing of outputting a tactile signal in accordance with a usage presence/absence information included in tactile coded data.

In the above-described decoding apparatus according to the present technology, it is desirable that the tactile coded data includes a tactile signal of only a single channel among usable channels being channels of tactile signals that can use an apparent movement, and output control information indicating an output channel and an output timing of the tactile signal, and the decoding unit outputs the tactile signal of the single channel in accordance with the output control information.

Therefore, in implementing tactile reproduction that uses an apparent movement, tactile coded data needs not include a tactile signal of each channel to which tactile stimulation is to be applied, and it is sufficient that a tactile signal of a single channel is included.

In the above-described decoding apparatus according to the present technology, it is desirable that the single channel is a channel with an earliest signal rising timing among signals of the usable channels.

Therefore, in applying earliest tactile stimulation among sequential tactile stimulation related to an apparent movement, it becomes unnecessary to stand by until a tactile signal indicating second or subsequent tactile stimulation is acquired.

In the above-described decoding apparatus according to the present technology, it is desirable that the decoding unit decodes the tactile coded data in which a size of a block indicating a processing unit in a time direction is made variable.

Therefore, as for a tactile signal serving as a time signal, a specific waveform portion and other portions can be treated as data including different blocks.

In the above-described decoding apparatus according to the present technology, it is desirable that the tactile signal is a signal that is based on a detection signal of a tactile sensor.

Therefore, tactile reproduction can be performed on the basis of actually-sensed tactile information.

In the above-described decoding apparatus according to the present technology, it is desirable that the tactile signal is a signal that is based on a voice signal.

Therefore, tactile information having high association with voice information can be reproduced.

Furthermore, a decoding method according to the present technology is a decoding method of decoding tactile coded data obtained by performing encoding of compressing an information amount, on a tactile signal using higher-order perception in a tactile sense.

Also by such a decoding method, effects similar to those of the above-described decoding apparatus according to the present technology can be obtained.

Moreover, a program according to the present technology is a program for causing an information processing device to implement a function of decoding tactile coded data obtained by performing encoding of compressing an information amount, on a tactile signal using higher-order perception in a tactile sense.

By such a program according to the present technology, the above-described decoding apparatus according to the present technology is implemented.

Effects of the Invention

According to the present technology, a tactile reproduction system can be made more efficient by achieving a data amount reduction of a tactile signal while ensuring reproducibility of a tactile sense.

Note that the effect described here is not necessarily limited, and may be any effect described in the present disclosure.

BRIEF DESCRIPTION OF DRAWINGS

FIG. 11 is a diagram illustrating an example of tactile stimulation to be reproduced, as a diagram for describing an example of encoding that uses an apparent movement.

FIG. 12 is a diagram exemplifying a relationship between a signal detected by a sensor, and recorded data, as a diagram for describing an example of encoding that uses an apparent movement.

FIG. 23 is a diagram illustrating an example of a GUI for adjusting a higher-order perception applied threshold value.

MODE FOR CARRYING OUT THE INVENTION

Hereinafter, embodiments according to the present technology will be described in the following order with reference to the attached drawings.
<1. First Embodiment>
[1-1. Overview of Tactile Reproduction System]
[1-2. Configuration of Encoding Apparatus]
[1-3. Configuration of Reproduction Apparatus]
[1-4. Configuration of Decoding Apparatus]
[1-5. Tactile Reproduction Method According to Embodiment]
(Encoding Method)
(Processing Procedure on Encoding Side)
(Functional Configuration and Processing Procedure on Decoding Side)
[1-6. Modified Example of First Embodiment]
<2. Second Embodiment>
[2-1. Overview of Tactile Reproduction System]
[2-2. Configuration of Reproduction Apparatus]
[2-3. Encoding Method]
<3. Conclusion of Embodiment>
<4. Present Technology>

Here, in this specification, each term is defined as follows.

Tactile stimulation: physical phenomenon for causing a human to perceive a tactile sense, such as a vibration phenomenon, for example.

Tactile presentation: to generate tactile stimulation.

Tactile information: information perceived by a tactile sense, such as vibration information, for example.

Tactile signal: signal indicating a pattern of tactile stimulation, such as a signal indicating a vibration waveform, for example.

Recipient: person who receives tactile presentation. Tactile characteristic: characteristic regarding a tactile sense of a human. Varies depending on the region (hand, face, foot and the like).

Tactile sensitivity: sensitivity for subjectively determining the intensity of tactile stimulation. Varies depending on the receptor or the region in a human body.

Coded data: data obtained by encoding a signal. A stream and a frame serve as a more specific concept.

Tactile coded data: data obtained by encoding a tactile signal.

1. FIRST EMBODIMENT 1-1. Overview of Tactile Reproduction System

Figure 1:
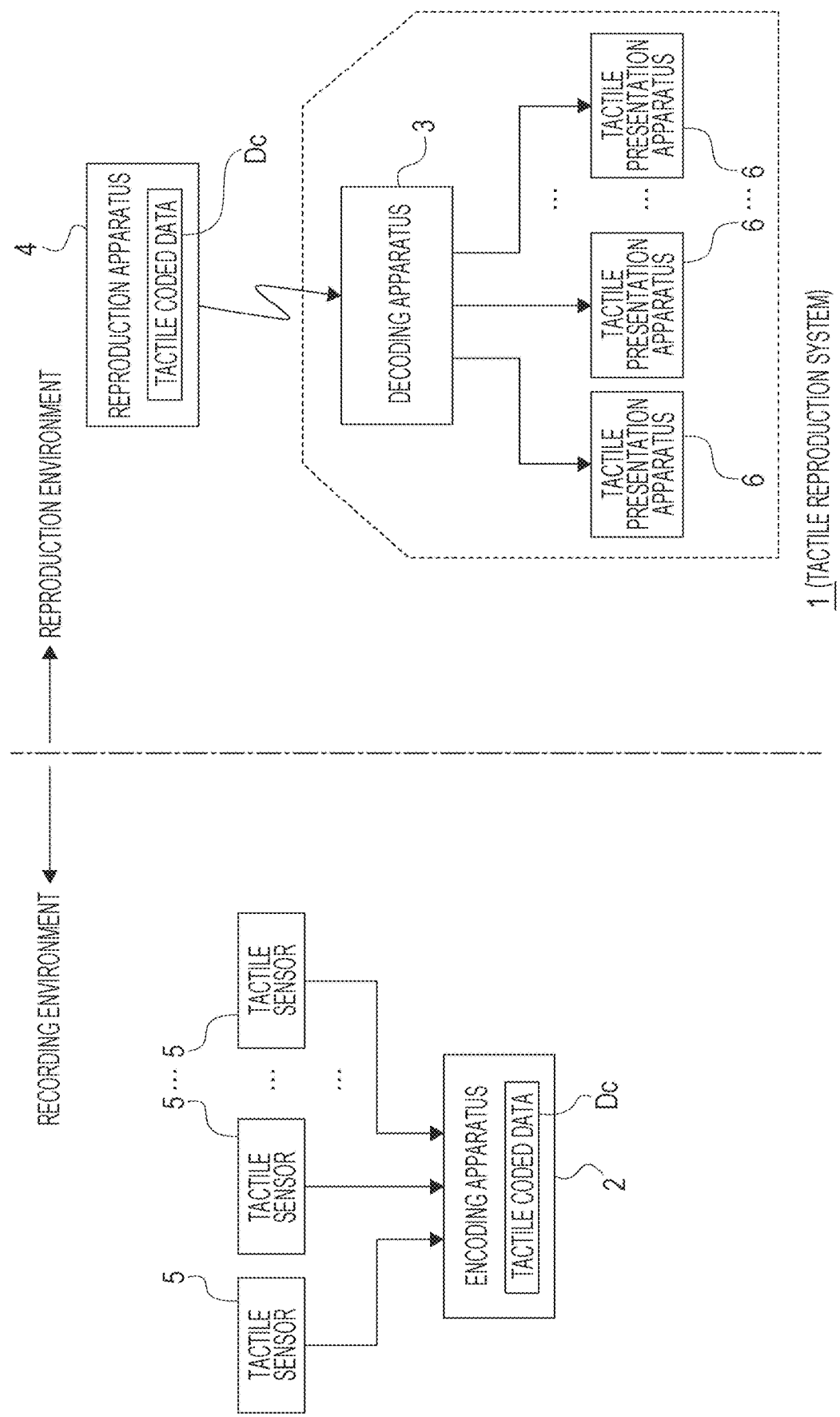
FIG. 1 is a diagram illustrating a configuration example of a tactile reproduction system including a decoding apparatus according to an embodiment of the present technology.

FIG. 1 illustrates a configuration example of a tactile reproduction system 1 including a decoding apparatus (decoding apparatus 3) according to an embodiment of the present technology.

First of all, in the present embodiment, an environment for implementing tactile reproduction is divided into a recording environment for encoding a tactile signal obtained by sensing targeted tactile information (tactile stimulation), and recording tactile coded data Dc obtained by the encoding, and a reproduction environment for reproducing the tactile information on the basis of a tactile signal obtained by decoding the tactile coded data Dc.

As illustrated in the drawing, the tactile reproduction system 1 includes a plurality of tactile sensors 5 and an encoding apparatus 2 to which these tactile sensors 5 are connected, in the recording environment, and includes a reproduction apparatus 4 configured to acquire the tactile coded data Dc, the decoding apparatus 3 configured to wirelessly communicate with the reproduction apparatus 4, and a plurality of tactile presentation apparatuses 6 connected with the decoding apparatus 3, in the reproduction environment.

The tactile sensor 5 is a sensor that performs sensing of tactile stimulation. In this example, a vibration sensor such as a piezo pickup sensor or an acceleration sensor is used. The tactile sensor outputs vibration or a motion as a voltage change by being brought into contact with a target object of sensing, that is to say, a human body in this example.

In this example, the tactile sensors 5 are connected to the encoding apparatus 2 in a wired manner, and the tactile sensors 5 are attached to different regions of a human body serving as a target object, and sense tactile stimulation generated in the respective regions.

The encoding apparatus 2 includes a computer device such as, for example, a central processing unit (CPU) and a digital signal processor (DSP), performs encoding of a detection signal (tactile signal) output by each of the tactile sensors 5, in compliance with a predetermined data format, and records the tactile coded data Dc obtained by the encoding, on a storage device provided inside, for example.

The reproduction apparatus 4 includes a computer device such as a CPU and a DSP, and transmits the acquired tactile coded data Dc to the decoding apparatus 3. For example, the tactile coded data Dc recorded in the recording environment is acquired by the reproduction apparatus 4 via a required network such as the Internet. Alternatively, the tactile coded data Dc can also be recorded on a portable storage medium, and the tactile coded data Dc can be acquired by the reproduction apparatus 4 via the storage medium.

The decoding apparatus 3 decodes the tactile coded data Dc received by the reproduction apparatus 4, and drives each of the tactile presentation apparatuses 6 on the basis of a tactile signal obtained by the decoding.

The tactile presentation apparatus 6 is assumed to be a device that generates tactile stimulation. In this example, a vibration device such as a vibrator or an actuator is used.

In this example, the tactile presentation apparatuses 6 are attached to different regions in a human body of a recipient, and reproduce tactile stimulation sensed by the corresponding tactile sensors 5.

Here, in this example, each of the tactile presentation apparatuses 6 is connected to the decoding apparatus 3 in a wired manner, and a portion in the drawing that is surrounded by a broken line, that is to say, the decoding apparatus 3 and the tactile presentation apparatuses 6 are assumed to be a part attached to a recipient.

The tactile reproduction system 1 can also have a configuration in which the reproduction apparatus 4 and each of the tactile presentation apparatuses 6 are connected in a wired manner, by providing functions of the decoding apparatus 3 in the reproduction apparatus 4, but in this case, the recipient to which the tactile presentation apparatuses 6 are attached might feel bothersome. The bothersome feeling is expected to increase as the number of regions to which tactile stimulation is applied increases.

By the configuration of the tactile reproduction system 1 that is illustrated in FIG. 1, it becomes possible to prevent the recipient from feeling bothersome as described above.

The tactile reproduction system 1 illustrated in FIG. 1 is formed as a system that reproduces a tactile sense of each region that is perceived by a person to which the tactile sensor 5 is attached, in a recipient, and as a system that can also handle a case where the person and the recipient are arranged remotely.

Note that, in the present embodiment, the number of tactile sensors 5 and the number of tactile presentation apparatuses 6, that is to say, the number of regions of a human body from which tactile stimulation is sensed and reproduced is at least three or more.

1-2. Configuration of Encoding Apparatus

Figure 2:
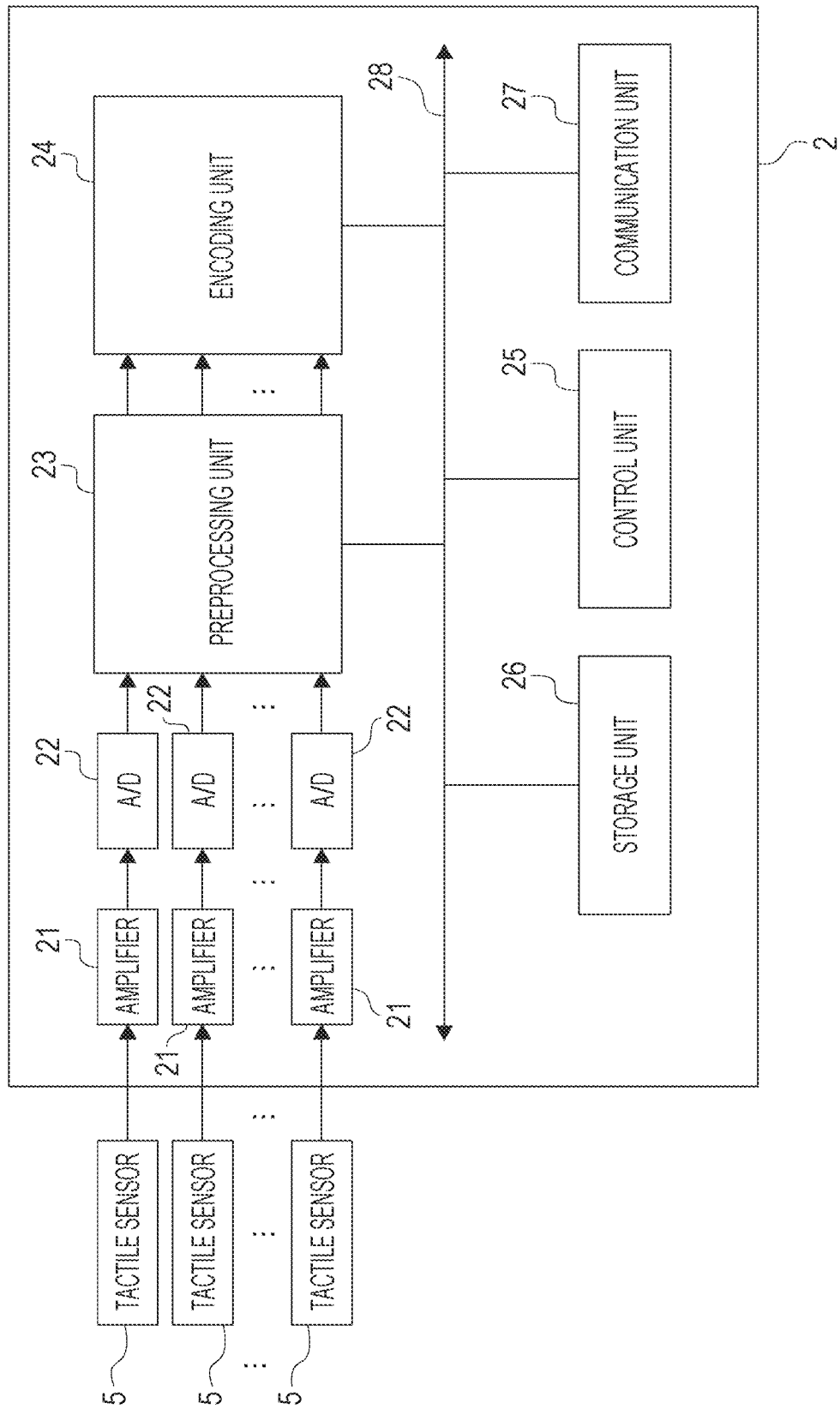
FIG. 2 is a diagram for describing an inner configuration example of an encoding apparatus according to an embodiment.

FIG. 2 is a diagram for describing an inner configuration example of the encoding apparatus 2. Note that FIG. 2 illustrates the tactile sensors 5 illustrated in FIG. 1, together with the inner configuration example of the encoding apparatus 2.

As illustrated in the drawing, the encoding apparatus 2 includes a plurality of amplifiers 21, a plurality of A/D converters 22, a preprocessing unit 23, an encoding unit 24, a control unit 25, a storage unit 26, a communication unit 27, and a bus 28. The preprocessing unit 23, the encoding unit 24, the control unit 25, the storage unit 26, and the communication unit 27 are connected via the bus 28 and enabled to perform data communication with each other.

A detection signal from each of the tactile sensors 5 is input to a corresponding one of the amplifiers 21, adjusted to an appropriate dynamic range, and then, input to a corresponding one of the A/D converters 22, and subjected to analog/digital conversion (A/D conversion).

Each A/D-converted detection signal (that is, a tactile signal of each region) is input to the preprocessing unit 23. In the preprocessing unit 23, various types of digital signal processing such as noise removal and calibration of a sensor characteristic of the tactile sensor 5 are performed.

Each tactile signal having been subjected to signal processing performed by the preprocessing unit 23 is input to the encoding unit 24.

The encoding unit 24 includes a DSP, for example, and encodes each of the input tactile signals in compliance with a predetermined data format, and obtains the above-described tactile coded data Dc.

Note that encoding of tactile signals according to the present embodiment will be described later.

The control unit 25 includes a microcomputer including a CPU, a read only memory (ROM), a random access memory (RAM), and the like, for example, and controls the entire encoding apparatus 2 by executing processing in accordance with a program stored in the ROM.

For example, the control unit 25 performs data communication with an external device via the communication unit 27.

The communication unit 27 is configured to be able to perform data communication with an external device via a network such as the Internet, and the control unit 25 is configured to be able to perform data communication with an external device connected to the network, via the communication unit 27. In particular, the control unit 25 is configured to be able to transmit the tactile coded data Dc obtained by the encoding unit 24, to an external device via the communication unit 27.

The storage unit 26 comprehensively represents a storage device such as a hard disk drive (HDD) and a solid state drive (SSD), for example, and is used for various types of data storage in the encoding apparatus 2. For example, data necessary for control by the control unit 25 is stored into the storage unit 26. Furthermore, on the basis of control of the control unit 25, the tactile coded data Dc obtained by the encoding unit 24 can also be stored into the storage unit 26.

1-3. Configuration of Reproduction Apparatus

Figure 3:
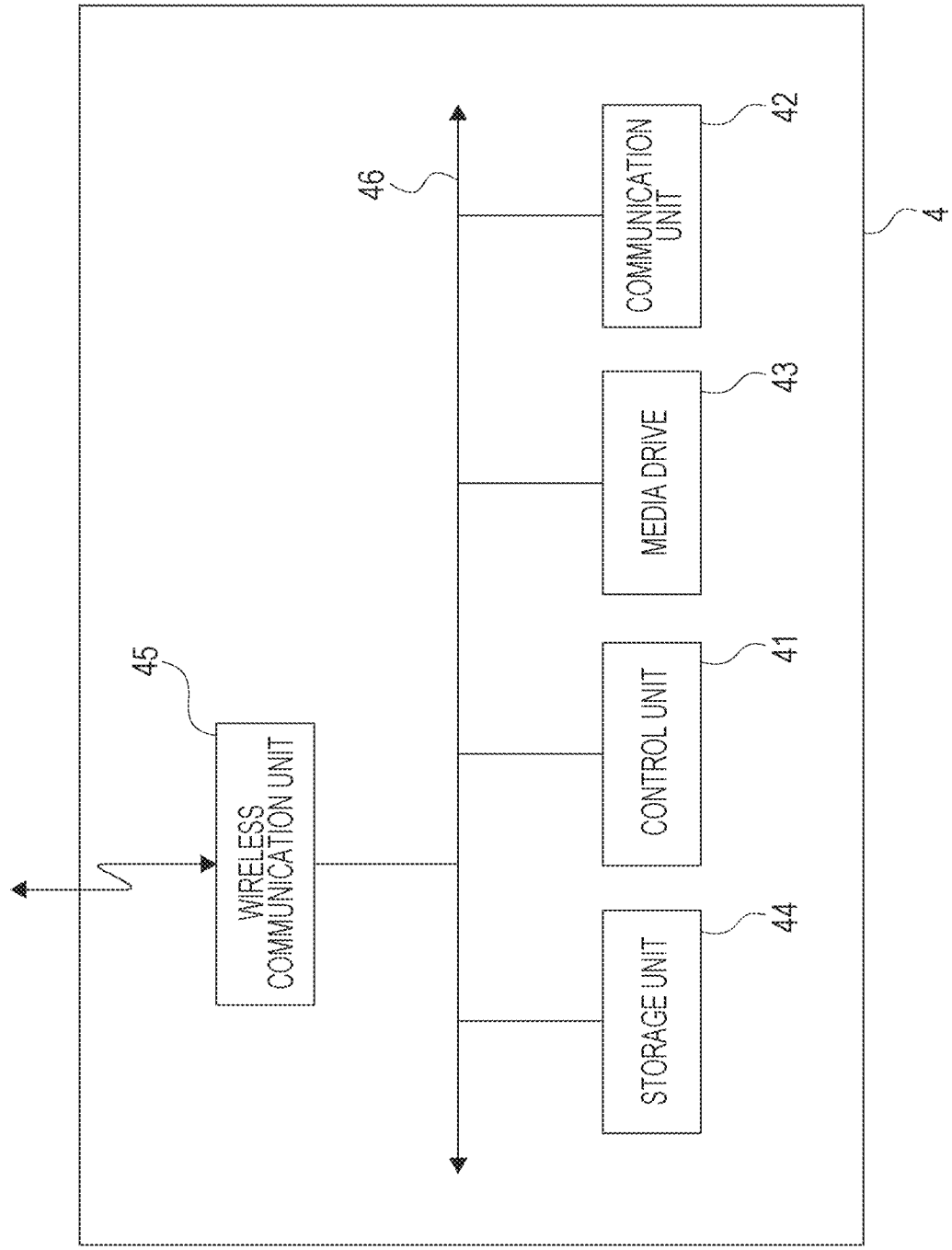
FIG. 3 is a diagram illustrating an inner configuration example of a reproduction apparatus according to a first embodiment.

FIG. 3 is a diagram illustrating an inner configuration example of the reproduction apparatus 4.

As illustrated in the drawing, the reproduction apparatus 4 includes a control unit 41, a communication unit 42, a media drive 43, a storage unit 44, and a wireless communication unit 45, and also includes a bus 46 that connects these components in such a manner that data communication can be performed with each other.

The control unit 41 includes a microcomputer including, for example, a CPU, a ROM, a RAM, and the like, and controls the entire reproduction apparatus 4.

The communication unit 42 is configured to be able to perform data communication with an external device via a network such as the Internet. The control unit 41 is configured to be able to perform data communication with an external device connected to the network, via the communication unit 42. In particular, the control unit 41 is configured to be able to cause the communication unit 42 to receive the tactile coded data Dc from an external device such as a server device on the network.

The media drive 43 is configured to detachably include a portable storage medium, and has a configuration as a reader/writer unit enabled to perform data writing and reading with respect to the attached storage medium. Examples of storage media supported by the media drive 43 include a memory card (for example, portable flash memory), an optical disc storage medium, and the like.

By the media drive 43, the tactile coded data Dc recorded on the portable storage medium can be read out.

The storage unit 44 comprehensively represents a storage device such as an HDD and an SSD, for example, and is used for various types of data storage in the reproduction apparatus 4. For example, data necessary for control by the control unit 41 is stored into the storage unit 44. Furthermore, on the basis of control of the control unit 41, the tactile coded data Dc read out by the media drive 43, and the tactile coded data Dc received by the communication unit 42 from an external device can also be stored into the storage unit 44.

The wireless communication unit 45 performs near field communication using a predetermined communication method such as Bluetooth (registered trademark), for example.

Here, as a part of the above-described overall control, the control unit 41 performs control for executing reception of the tactile coded data Dc by the communication unit 42 and readout of the tactile coded data Dc by the media drive 43. Furthermore, the control unit 41 controls the wireless communication unit 45 to transmit the tactile coded data Dc obtained via the communication unit 42 or the media drive 43, to the decoding apparatus 3.

1-4. Configuration of Decoding Apparatus

Figure 4:
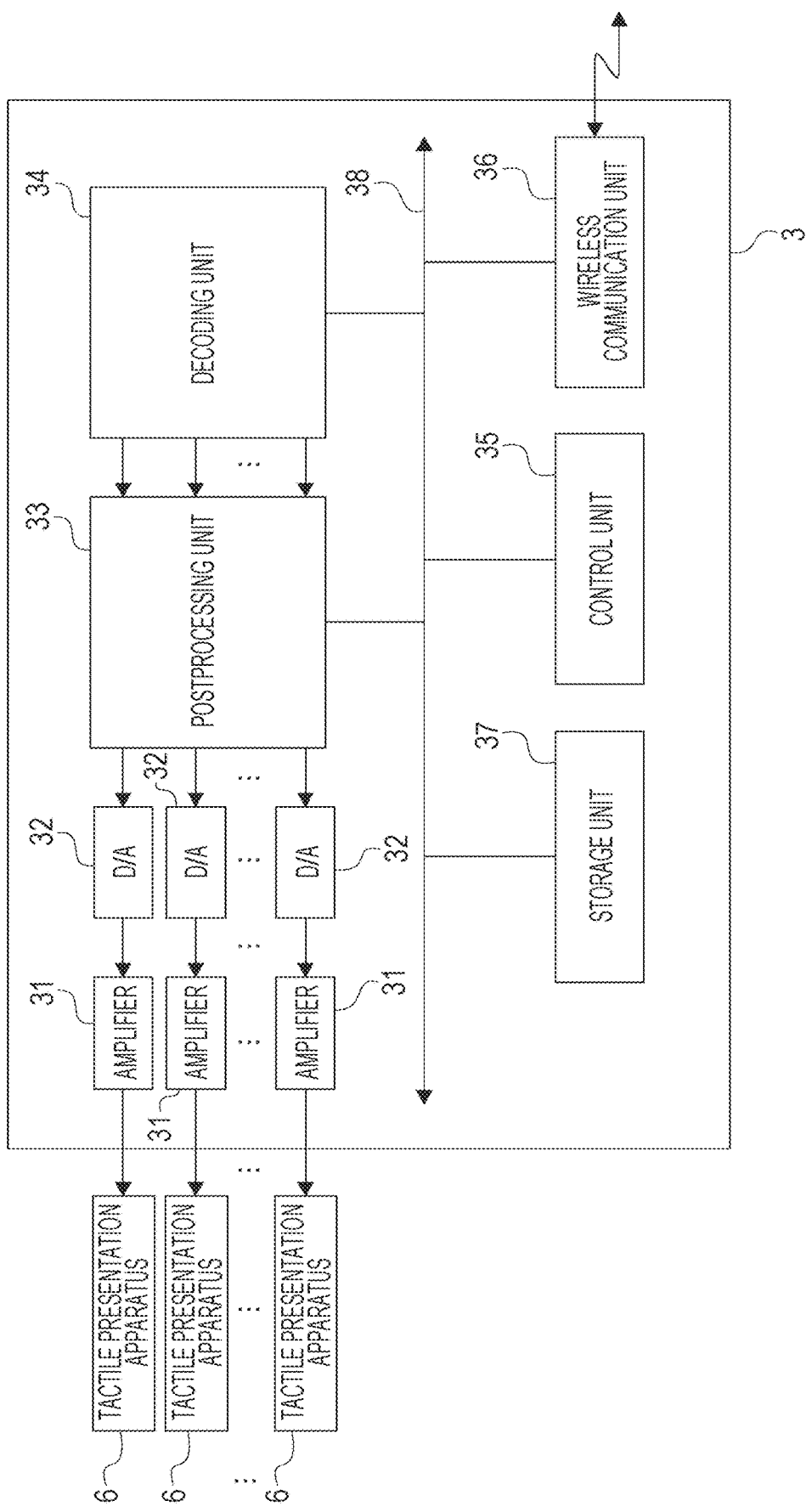
FIG. 4 is a diagram for describing an inner configuration example of a decoding apparatus according to an embodiment.

FIG. 4 is a diagram for describing an inner configuration example of the decoding apparatus 3, and illustrates the tactile presentation apparatuses 6 together with the inner configuration example of the decoding apparatus 3.

As illustrated in the drawing, the decoding apparatus 3 includes a plurality of amplifiers 31, a plurality of D/A converters 32, a postprocessing unit 33, and a decoding unit 34, and also includes a control unit 35, a wireless communication unit 36, a storage unit 37, and a bus 38. The postprocessing unit 33, the decoding unit 34, the control unit 35, the wireless communication unit 36, and the storage unit 37 are connected via the bus 38 and enabled to perform data communication with each other.

The control unit 35 includes a microcomputer including, for example, a CPU, a ROM, a RAM, and the like, and controls the entire decoding apparatus 3.

The wireless communication unit 36 performs near field communication using a method that can perform communication with the wireless communication unit 45 in the reproduction apparatus 3, such as Bluetooth, for example. The tactile coded data Dc transmitted from the reproduction apparatus 3 is received by the wireless communication unit 36.

The storage unit 37 is assumed to be a storage device similar to the storage unit 26, the storage unit 44, and the like, for example, and is used for the storage of various types of data to be used by the control unit 35 and the like.

The decoding unit 34 decodes the tactile coded data Dc input via the wireless communication unit 36, using a method to be described later, and obtains a tactile signal of each region. The tactile signal of each region that has been obtained by the decoding unit 34 is input to the postprocessing unit 33.

The postprocessing unit 33 performs, as necessary, signal processing such as the calibration of the tactile presentation apparatuses 6 and predetermined filter processing on the input tactile signal of each region.

Each tactile signal having passed through the postprocessing unit 33 is input to the corresponding one D/A converter 32 and subjected to digital/analog conversion (D/A conversion), and then, adjusted to an appropriate dynamic range by the corresponding one amplifier 31, and output to the corresponding one tactile presentation apparatus 6.

Therefore, each of the tactile presentation apparatuses 6 is driven on the basis of the tactile signal, and can apply tactile stimulation to be sensed in a detection environment, to a recipient (that is, can reproduce tactile information).

Note that the above description has been given only of a tactile signal, but a configuration of recording a voice signal or a video signal together with a tactile signal, and providing sound or a video to a recipient together with tactile information can also be employed.

1-5. Tactile Reproduction Method According to Embodiment (Encoding Method)

Hereinafter, a tactile reproduction method according to a first example of the first embodiment will be described.

First of all, a tactile reproduction method according to an embodiment is a method focused on a tactile characteristic of a human.

Figure 5:
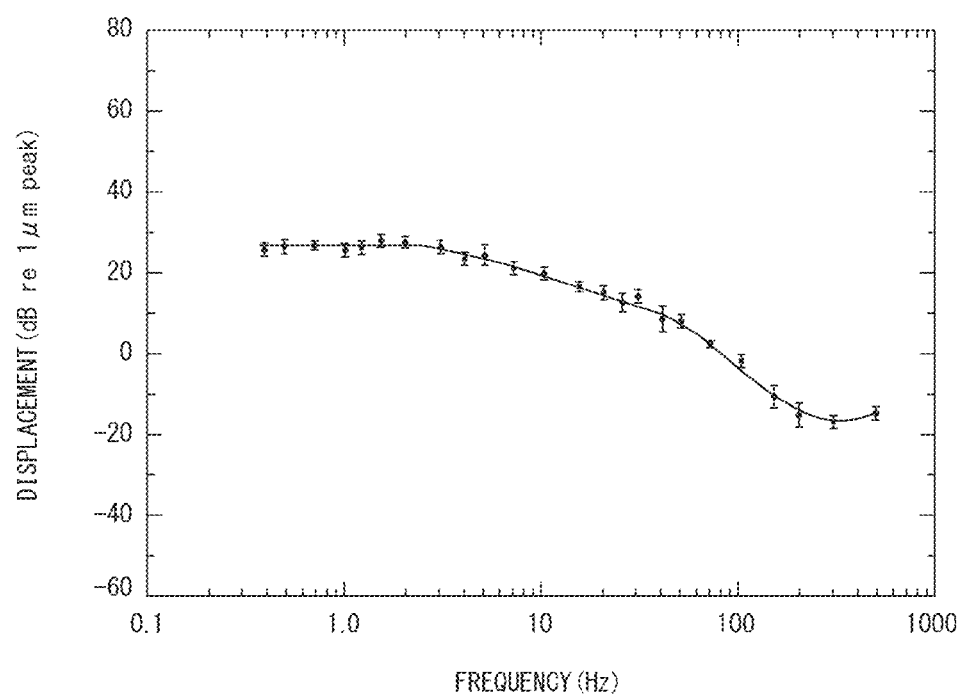
FIG. 5 is an explanatory diagram of a vibration detection threshold curve.

As an indication of tactile sensitivity of a human, a vibration detection threshold curve illustrated in FIG. 5 has been reported. Note that, in FIG. 5, a horizontal axis indicates a frequency and a vertical axis indicates the magnitude of tactile stimulation (vibration: displacement in this example).

The vibration detection threshold curve illustrated in FIG. 5 indicates whether or not a human feels the vibration as a tactile sense, that is, indicates an example of tactile sensitivity investigated through an experiment. A human cannot perceive vibration smaller than the curve as a tactile sense.

The vibration detection threshold curves illustrated in FIG. 5 indicate that a human can feel vibration up to about 1 kHz as tactile stimulation. Furthermore, FIG. 5 does not illustrate values equal to or larger than 1 kHz, but it has been known that, actually, a human can perceive vibration at the frequency of about several kHz as tactile stimulation although the sensitivity is not high.

In a conventional application of tactile reproduction, in most cases, vibration of about 200 Hz at the most is targeted. This is attributed to the fact that the highest tactile sensitivity of a human is obtained at about 200 Hz.

However, as described above, it has been revealed from various past experiments that a human can feel vibration up to 1 kHz as tactile stimulation, and there is no choice but to say that it is difficult for the conventional application to reproduce a tactile sense having a high sense of reality.

For example, vibration caused when a cork of a bottle is pulled out actually includes a high frequency such as several kHz. If vibration up to several hundreds Hz of the vibration is reproduced, a tactile sense totally different from an actual tactile sense is obtained.

In view of the foregoing, in the present embodiment, a sense of reality is further enhanced by widening a bandwidth of characteristics of a tactile signal and the tactile presentation apparatus 6 to about 1 kHz.

Specifically, in the present embodiment, a method of obtaining a tactile signal by sensing tactile information such as vibration that has been generated in reality, and performing tactile presentation in accordance with the tactile signal is employed.

In recent years every piece of information is digitized and used. Similarly, handling of digitalized tactile signals will be considered.

A digitalized data amount can be considered on the basis of a bit depth necessary per unit time, that is, a bit rate. For example, in the vibration detection threshold curve illustrated in FIG. 5, a region that can be felt by a human is at least 50 dB (−20 dB to 30 dB) or more on the vertical axis and about 1000 Hz on the horizontal axis. In this example, in view of a distribution of tactile information actually felt by a human, signals in a range of +20 dB from the threshold curve are sensed.

According to this, in the targeted frequency band up to 1000 Hz, a vibration range becomes 70 dB (−20 dB to 50 dB).

If the vibration range is set to 70 dB in this manner in the targeted frequency band up to 1000 Hz, in a case where a tactile signal is digitalized by linear pulse code modulation (LPCM), because an amplitude that can be represented by one bit is 6 dB, nine bits are necessary as for the vertical axis, and 2000 Hz (sample/sec) being a double sampling frequency is necessary for reproducing up to 1000 Hz. Thus, a necessary bit rate B0 is obtained by the following Formula [1].

$$B0=12 \text{ bit/sample} \times 2000 \text{ sample/sec}=24 \text{ kbit/sec} \quad [1]$$

Because the value itself is extremely small as compared with a bit rate=700 kbps/ch of compact disc (CD) being a representative format of a voice signal, for example, if the tactile signal is additionally incorporated into a certain system, a large problem seems to hardly occur.

However, as described above, it has been seen that a bandwidth of tactile signals that can be felt by a human extends up to several kHz. For example, in a case where tactile signals are reproduced up to 2000 Hz, a bit rate becomes a double of 48 kbit/sec as compared with Formula [1].

Furthermore, unlike a visual sense (two eyes) and an auditory sense (two ears), tactile senses exist everywhere on the body surface of a human. Tactile senses exist at ten points in the fingertips of both hands, and if tactile signals of all of these points are to be handled, a bit rate further increases to 480 kbit/sec, which is a tenfold bit rate. If the number of points are increased by considering each joint of a finger and a palm, a bit rate dramatically increases.

Moreover, basically, a tactile signal is a one-dimensional signal, but a physical phenomenon of vibration can be considered in three axes (x, y, z). If all of these are handled, a necessary bit rate further increases to 1440 kbit/sec, which is a threefold bit rate, but this value is a large value exceeding 1411 kbit/sec of audio CD.

In this manner, although a bit rate regarding one tactile signal is not so large, if a tactile sense that can be felt by a human is considered, an immense amount is required, and large load is surely applied onto a system that handles tactile signals.

Here, because the tactile presentation apparatus 6 is brought into contact with a human body, in a configuration in which the decoding apparatus 3 and the reproduction apparatus 4 are connected in a wired manner, a recipient feels bothersome, and wireless connection as illustrated in FIG. 1 is desired. If a conventional major wireless method is considered to be used for implementing wireless communication at this time, in a broadband wireless method such as Wi-Fi (registered trademark), for example, the capacity of a battery might become large due to large consumed power, and downsizing of a unit including the tactile presentation apparatuses 6 and the decoding apparatus 3 is affected. Furthermore, in Wi-Fi, because a processing time is required for a procedure performed from when a signal transmission request is generated, to when the signal transmission request is actually received, large latency might occur.

In contrast to this, in the case of a near field communication method such as Bluetooth, because a structure of transmitting and receiving a signal with lower power consumption and lower latency as compared with other wireless methods can be used, the near field communication method is considered to be suitably used for the purpose of tactile reproduction. However, in these near field communication methods, an information transmission amount is restricted, and when a voice signal and a tactile signal are considered to be transmitted and received synchronously, for example, it can be said that an amount of data allocated to a tactile signal is small.

Furthermore, a service that streams a video and voice via the Internet has become common, and in a case where adding tactile information for further enhancing a realistic feeling is considered, because a communication speed of a line is already insufficient in the current situation, it can be said that an amount of data allocated to tactile information when a data amount is adjusted by a Quality of Service (QoS) function is small.

In view of the above-described circumstances, encoding a tactile signal highly efficiently and transmitting the encoded tactile signal is considered. For example, in a case where a vibration signal is treated as a tactile signal, a voice encoding method for a voice signal that is a one-dimensional signal similarly to a vibration signal, such as MPEG Audio Layer3 (MP3) or Advanced Audio Coding (AAC), for example, is also considered to be directly applied to a vibration signal, but the voice encoding method is originally an encoding method that considers aural characteristics of a human, and does not consider characteristics of a tactile sense. Thus, even if the voice encoding method is applied to a vibration signal, information important for a tactile sense is highly likely to be damaged, and the voice encoding method cannot implement optimum encoding.

In view of the foregoing, the present embodiment aims to make a tactile reproduction system more efficient, by achieving a data amount reduction of a tactile signal while ensuring reproducibility of a tactile sense.

First of all, a specific example of a tactile device assumed in the present embodiment will be described with reference to FIGS. 6 and 7.

Figure 6:
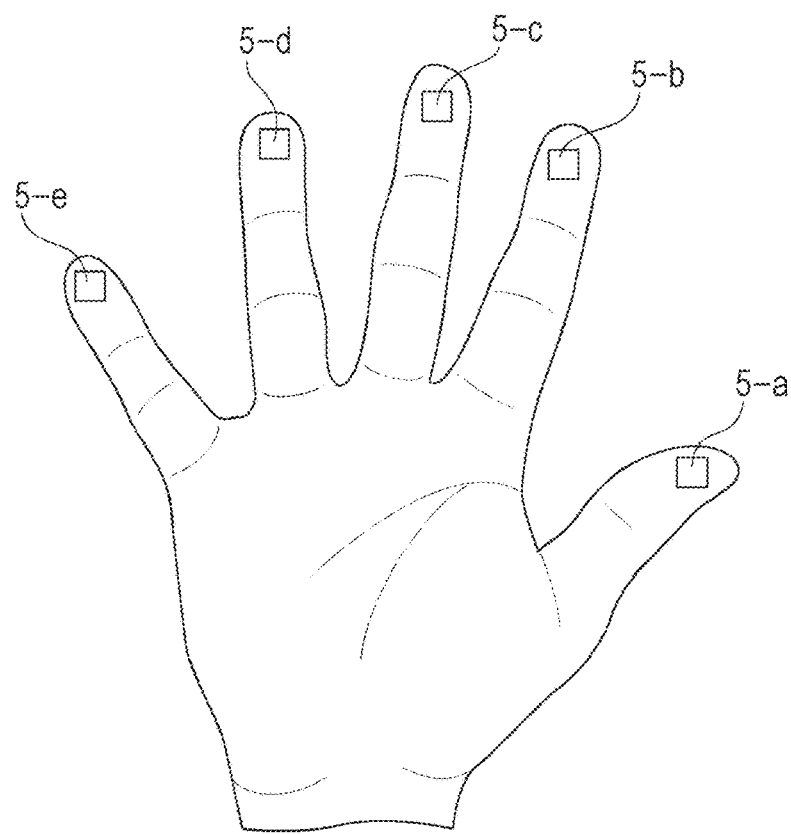
FIG. 6 is a diagram for describing an example of a finger contact type tactile device.

FIG. 6 is a diagram for describing an example of a finger contact type tactile device. Specifically, FIG. 6 schematically illustrates a correspondence relationship between fingers and tactile sensors 5 used for presenting tactile information to the fingers of a hand.

In this case, five tactile sensors 5 each attached to a corresponding one of the fingers are provided as tactile sensors 5. Hereinafter, the tactile sensors 5 attached to the respective fingers are distinguished from each other by adding "-a" to "-e" to the ends of reference numerals in order from a thumb side.

Note that FIG. 6 exemplifies only the tactile sensors 5, but five tactile presentation apparatus 6 (6-a to 6-e) to be attached to the respective fingers are similarly provided as the tactile presentation apparatuses 6.

In a case where such a finger contact type tactile device is used, in the recording environment, for example, a feeling felt when a fingertip touches an object, impact generated when a ball is hit with a bat, and the like can be sensed, and tactile signals corresponding to five channels can be acquired by one hand and tactile signals corresponding to ten channels can be acquired by both hands. Then, on the basis of the acquired tactile signals, in the reproduction environment, a recipient having the tactile presentation apparatuses 6-a to 6-e attached to the respective fingers can be caused to feel a feeling felt when an object is touched, impact generated when a ball is hit with a bat, and the like.

Note that, as a tactile device for implementing such tactile reproduction, for example, a configuration independent for each finger like a fingerstall type, or an integrated configuration like a glove type can also be employed.

Figure 7:
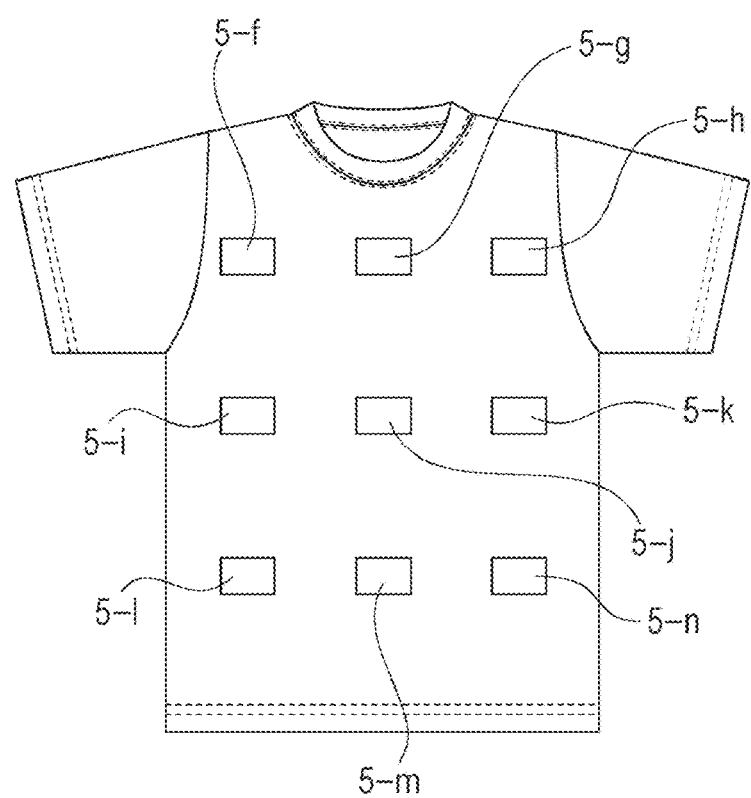
FIG. 7 is a diagram for describing an example of a body contact type tactile device.

FIG. 7 is a diagram for describing an example of a body contact type tactile device. Specifically, FIG. 7 schematically illustrates tactile sensors 5 used for presenting tactile information to regions from a breast to a belly, and a positional relationship between the tactile sensors 5.

In the example in this drawing, the tactile sensors 5 are arranged separately on three rows in a vertical direction on the front surface side (breast and belly side) of a body. On each row, the number of the tactile sensors 5 arranged in a horizontal direction is three, and nine tactile sensors 5 in total are arranged on the front surface side of the body. As illustrated in the drawing, these nine tactile sensors 5 are distinguished from each other by adding "-f" to "-n" to the ends of the reference numerals.

Note that FIG. 7 exemplifies only the tactile sensors 5, but nine tactile presentation apparatuses 6 (6-f to 6-n) having similar positional relationship are also provided as the tactile presentation apparatuses 6.

In a case where such a body contact type tactile device is used, in the recording environment, for example, by sensing a feeling felt when a body touches an object, impact generated when a body is shot by a gun or cut by a sword, and the like, tactile signals corresponding to nine channels can be acquired on the front surface, and tactile signals corresponding to 18 channels in total including the tactile signals acquired on the back surface can be acquired. Then, on the basis of the acquired tactile signals, in the reproduction environment, a recipient having the tactile presentation apparatuses 6-f to 6-n attached in a positional relationship respectively corresponding to the tactile sensors 5-f to 5-n in the recording environment can be caused to feel a feeling felt when a body touches an object, impact generated when a body is shot by a gun or cut by a sword, and the like.

Note that the body contact type tactile device is considered to be provided on a shirt-type cloth as illustrated in the drawing, or a jacket-type cloth, for example.

Here, similarly to other feelings of a human, higher-order perception is reported also for a tactile sense. The higher-order perception is a phenomenon in which information regarding physical stimulation is integrated by a brain, and connected with complicated perception, and in the case of a tactile sense, "phantom sensation" (Alles, D. S.: Information Transmission by Phantom Sensations, IEEE Trans. Man-machine Systems, Vol. 11, pp. 85-91, 1970), and "Apparent Movement" (Bekesy, G. V.: Sensation on the Skin Similar to Directional Hearing, Beats and Harmonics of the Ear, Journal of the Acoustic Society of America, Vol. 29, No. 4, pp. 489-501, 1957) are mainly reported.

Figure 8:
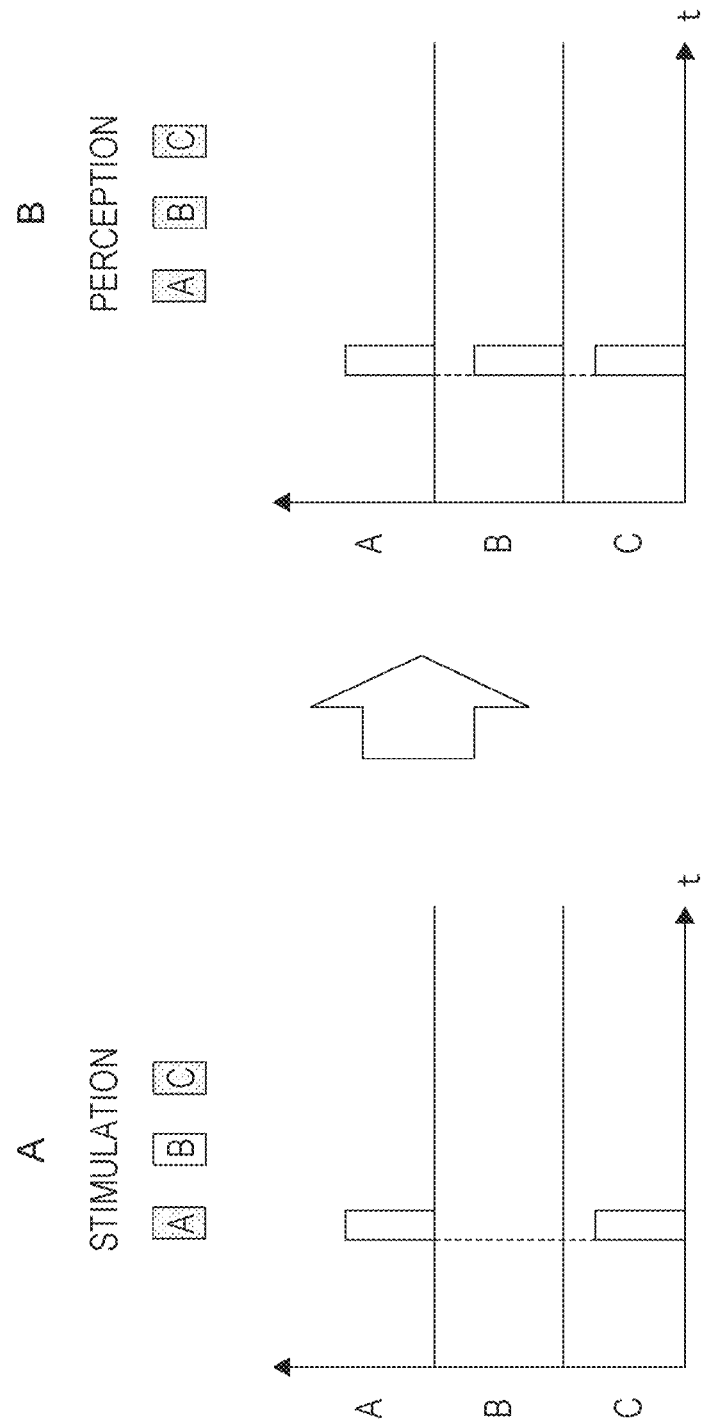
FIG. 8 is an explanatory diagram illustrating phantom sensation.

FIG. 8 is an explanatory diagram illustrating phantom sensation.

FIG. 8A illustrates that, among three points A to C of a human body that are separated from each other by a certain distance, tactile stimulation is simultaneously applied only to the points A and C at both ends. According to phantom sensation, as illustrated in FIG. 8B, also at the point B to which stimulation is not applied, stimulation is perceived as if stimulation was applied simultaneously with the points A and C. In other words, the phantom sensation is a phenomenon in which a stimulation image is perceived between a stimulation point and a stimulation point. At this time, in a case where stimulation intensities of the stimulation points are different, the stimulation image is perceived with being biased toward the stimulation point with higher stimulation intensity.

Figure 9:
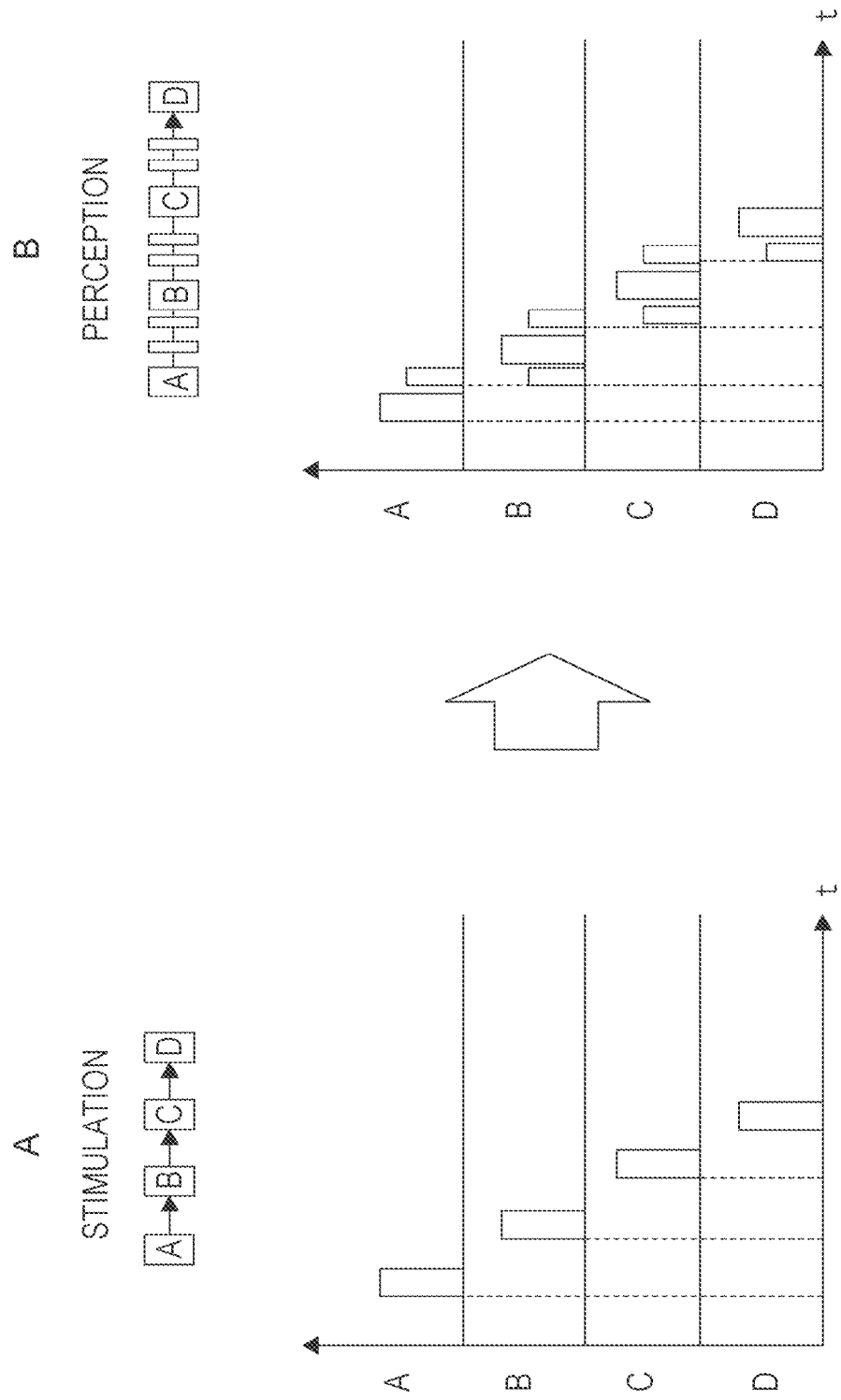
FIG. 9 is an explanatory diagram illustrating an apparent movement.

FIG. 9 is an explanatory diagram illustrating an apparent movement.

FIG. 9A illustrates that, to four points A to D of a human body that are separated from each other by a certain distance, instantaneous tactile stimulation is chronologically applied in the order from the points A to D. FIG. 9B illustrates stimulation perceived in accordance with the stimulation illustrated in FIG. 9A being applied.

An apparent movement means a phenomenon in which stimulation between stimulation points is interpolated by a discrete chronological movement of a stimulation point, and stimulation is perceived as if a stimulation point was moving.

Note that perceiving tactile stimulation using phantom sensation is known as disclosed in Reference Document 1 described below, for example.

Reference Document 1: Japanese Patent Application Laid-Open No. 2013-044706

In the present embodiment, efficient encoding of a tactile signal is implemented using the above-described higher-order perception is implemented.

Figure 10:
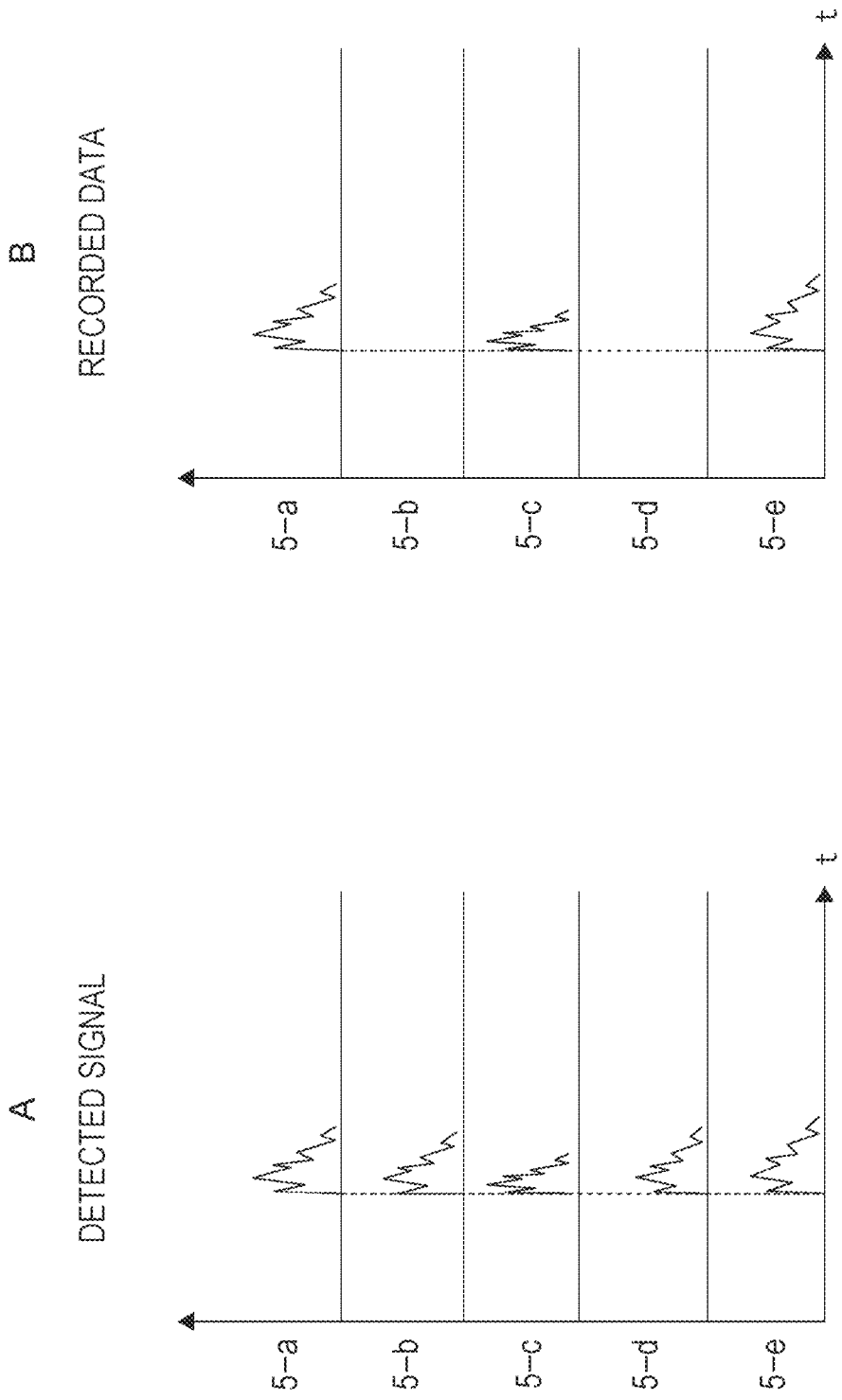
FIG. 10 is an explanatory diagram illustrating an example of encoding that uses phantom sensation.

First of all, an example of encoding that uses phantom sensation will be described with reference to FIG. 10. Here, an example in which a finger contact type tactile device as illustrated in FIG. 6 is used as a tactile device will be described.

Among fingers of a human, some fingers often exist at positions close to each other to some extent, due to the positional relationship between the fingers and the restraint condition of joints. Therefore, some fingers often simultaneously perceive certain tactile stimulation. For example, when a certain object is picked up by a hand, an operation of simultaneously touching the object and then grabbing the object with a plurality of fingertips is performed. When a bat or a handle is grasped, a plurality of fingertips simultaneously touches the bat or the handle. FIG. 10A illustrates tactile signals to be detected by the tactile sensors 5-a to 5-e illustrated in FIG. 6 when a ball is actually picked up. From FIG. 10A, it can be seen that, when a ball is picked up, all the fingers simultaneously perceive tactile stimulation with similar intensity.

If it is considered that tactile reproduction is performed using the tactile presentation apparatuses 6-a to 6-e for obtaining this perception, all tactile signals corresponding to the respective channels illustrated in FIG. 10A can be recorded as-is, but stimulation applied to the fingers existing between fingers, such as tactile signals detected by the tactile sensors 5-b and 5-d, specifically, can be omitted as illustrated in FIG. 10B, by using the generation of phantom sensation. In other words, an amount of tactile information to be recorded can be reduced.

If a structure in which the number of usage channels is variable is employed in digital encoding, this reduction can be implemented by temporarily excluding channels of the tactile sensors 5-b and 5-d from usage channels, and an information amount can be thereby temporarily reduced to ⅗ (reduction by 40%). Furthermore, even if an encoding method in which the number of usage channels is fixed is employed, by employing a method of allocating zero to symbols of signals in corresponding periods of the tactile sensors 5-b and 5-d, a reduction in information amount can be achieved. In other words, setting symbols to zero leads to drastically reducing an information entropy, and in a case where entropy encoding (variable-length coding) such as Huffman coding is employed, a very large information amount reduction effect can be obtained. Furthermore, because a reduction in the number of the tactile presentation apparatus 6 to be driven is achieved in addition to an information amount reduction, power saving and durability enhancement can also be achieved.

An example of encoding that uses an apparent movement will be described with reference to FIGS. 11 and 12.

Here, as an example of encoding that uses an apparent movement, an example of a case where a body contact type tactile device as illustrated in FIG. 7 is used will be described.

A body of a human is a region with a relatively broad area, and a movement or propagation of tactile stimulation is often perceived. Examples of actions for enhancing a realistic feeling include an action of cutting a body by a sword, an action of an insect or the like crawling, and the like. Here, a case where an action of cutting a body by a sword in an arrow direction in the drawing is performed as illustrated in FIG. 11, specifically, a case where an action of cutting a body in a direction from the upper part of the left breast toward a right belly part, and then cutting the body in a direction from the right belly part toward a left belly part is performed will be described as an example.

FIG. 12A exemplifies signals to be detected by the tactile sensors 5-f to 5-n when such an action is performed. As illustrated in the drawing, in this case, it can be seen that tactile stimulation is generated in the order of the tactile sensors 5-h, 5-j, 5-l, 5-m, and 5-n.

In such tactile stimulation generated in accordance with the movement of a certain object, a consciousness is given to a feeling of the movement, rather than a difference in property (intensity or frequency) of the tactile signal.

As stimulation applied when the above-described sword is moving, all tactile signals corresponding to the respective channels illustrated in FIG. 12A can be recorded as-is, but by interpolating stimulation between a start point and an end point of tactile stimulation using the generation of an apparent movement, tactile signals can be reduced while reproducing similar stimulation.

That is, if a structure of using accompanying information of actual data of a signal is employed in digital encoding, for example, as illustrated in FIG. 12B, while a tactile signal of the tactile sensor 5-h is recorded, tactile signals of the tactile sensors 5-j, 5-l, 5-m, and 5-n are not recorded, and instead, information indicating an instruction to reproduce the same tactile signal as the tactile signal of the tactile sensor 5-h at the respective positions of the tactile sensors 5-j, 5-l, 5-m, and 5-n at appropriate times is recorded as accompanying information ("accompanying information" in the drawing). Therefore, a reduction in information amount can be achieved while enabling reproduction of stimulation generated when a sword is moving. Specifically, in the above-described example, an information amount of the corresponding period can be reduced to about ($1/5$)+α (α corresponds to accompanying information) (reduction by 80−α %).

Note that the above description has been given of an example in which, among channels of tactile signals that can use an apparent movement, only a tactile signal of a single channel is recorded, but tactile signals of two or more channels can also be recorded. For example, in the case of tactile stimulation generated when a body is cut by a sword as exemplified in FIG. 11, due to a change in the orientation of the sword at the position of the tactile sensor 5-l, or the like, a difference in property is considered to be generated between stimulation generated at positions of the tactile sensors 5-h to 5-j, and stimulation generated at the position of the tactile sensor 5-l and subsequent sensors, and in this case, not only the tactile signal detected by the tactile sensor 5-h but also the tactile signal detected by the tactile sensor 5-l is also considered to be recorded for faithfully reproducing the difference in stimulation.

Figure 13:
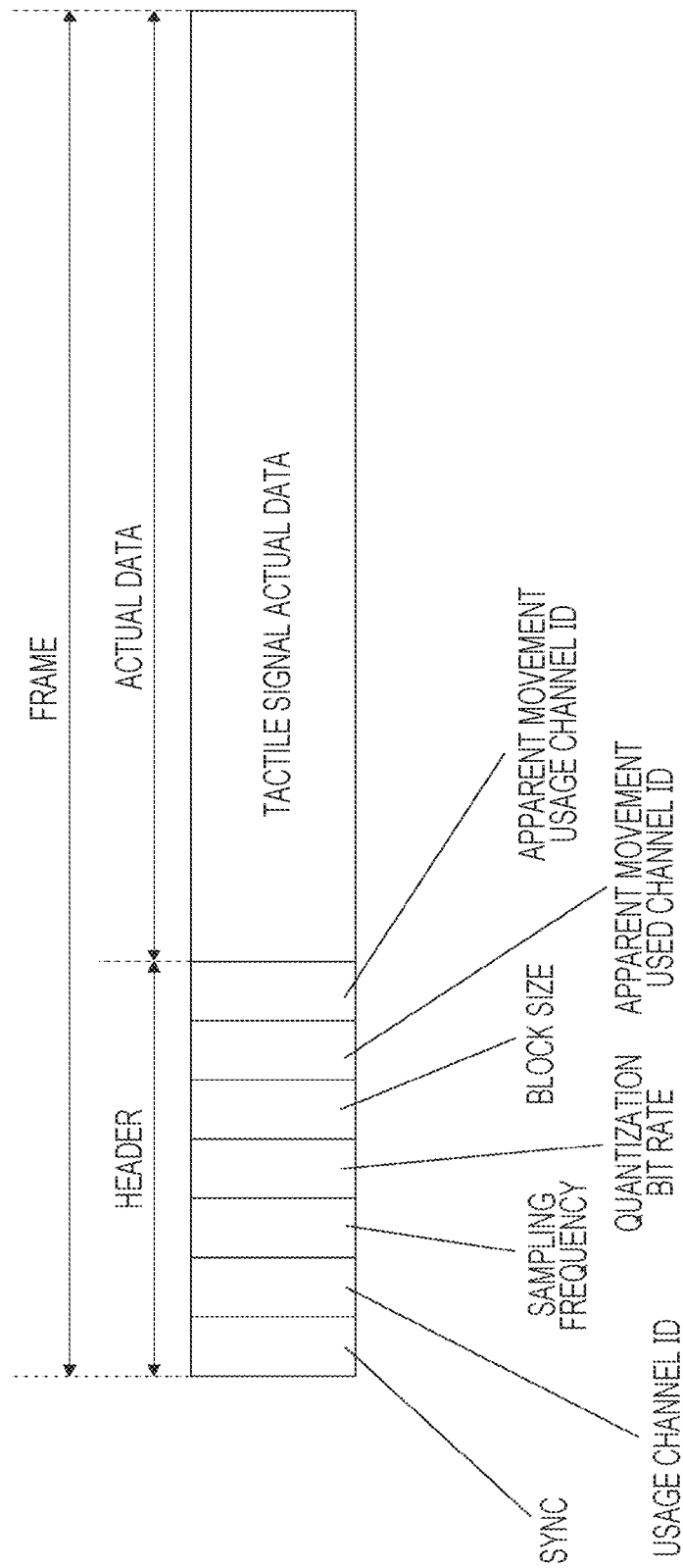
FIG. 13 is a diagram for describing an example of an encoding format that uses higher-order perception.

FIG. 13 is a diagram for describing an example of an encoding format that uses higher-order perception.

Here, a digital tactile signal is a signal obtained by sampling a chronological voltage change acquired by the tactile sensors 5, at a predetermined sampling frequency, and a signal similar to an LPCM method in a voice signal is assumed. In the encoding of this example, such a digital tactile signal is divided in a time direction into frames suitable for transmission, and a header (frame header) is added as additional information for each of the frames.

Specifically, a data format as illustrated in FIG. 13 is considered. As illustrated in the drawing, one frame is provided with a header region for storing information that serves as a frame header, and an actual data region for storing actual data of a tactile signal.

In the frame header, regions for storing pieces of information regarding a sync, a usage channel ID, a sampling frequency, a quantization bit rate, a block size, an apparent movement used channel ID, and an apparent movement usage channel ID are defined in order from the beginning.

The sync serves as an identifier indicating the beginning of a frame. The usage channel ID indicates an identifier of a channel to be used as a channel of a tactile signal, among the maximum number of channels supported by a system.

The sampling frequency and the quantization bit rate respectively indicate a sampling frequency of a tactile signal and a quantization bit rate per sample.

The block size indicates a size (the number of samples) in the time direction of the tactile signal to be stored in the frame. Here, a block indicates a processing unit in the time direction of the tactile signal. In the present embodiment, a block size is allowed to be changed for each frame. Note that a reason why a block size is made variable in this manner will be described later.

The apparent movement used channel ID indicates an identifier of a channel (hereinafter, will also be described as "used channel") of which a tactile signal is used by other channels, among channels that can use an apparent movement, when an apparent movement is used. For example, in the case of the example illustrated in FIG. 12B, information indicating a channel corresponding to the tactile sensor 5-h is stored in the apparent movement used channel ID.

The apparent movement usage channel ID indicates an identifier of a channel (hereinafter, will also be described as "usage channel") that uses a tactile signal of another channel, among channels that can use an apparent movement, when an apparent movement is used. For example, in the case of the example illustrated in FIG. 12B, information indicating channels of the tactile sensors 5-j, 5-l, 5-m, and 5-n that use the tactile signal of the tactile sensor 5-h is stored in the apparent movement usage channel ID.

In the actual data region following the header region, a tactile signal of each channel having a predetermined block size is stored.

By the encoding of the present embodiment, stream data having a configuration in which frames each having the above-described data structure are arranged in the time direction is obtained. The above-described tactile coded data Dc is recorded and transmitted in such a configuration of stream data.

Note that, in the stream data, actual data of a tactile signal is actually stored in a state of being interleaved for each channel, which is not illustrated in the drawing.

(Processing Procedure on Encoding Side)

Subsequently, a procedure of specific processing for implementing encoding of a tactile signal that uses the above-described higher-order perception will be described with reference to a flowchart in FIG. 14.

Figure 14:
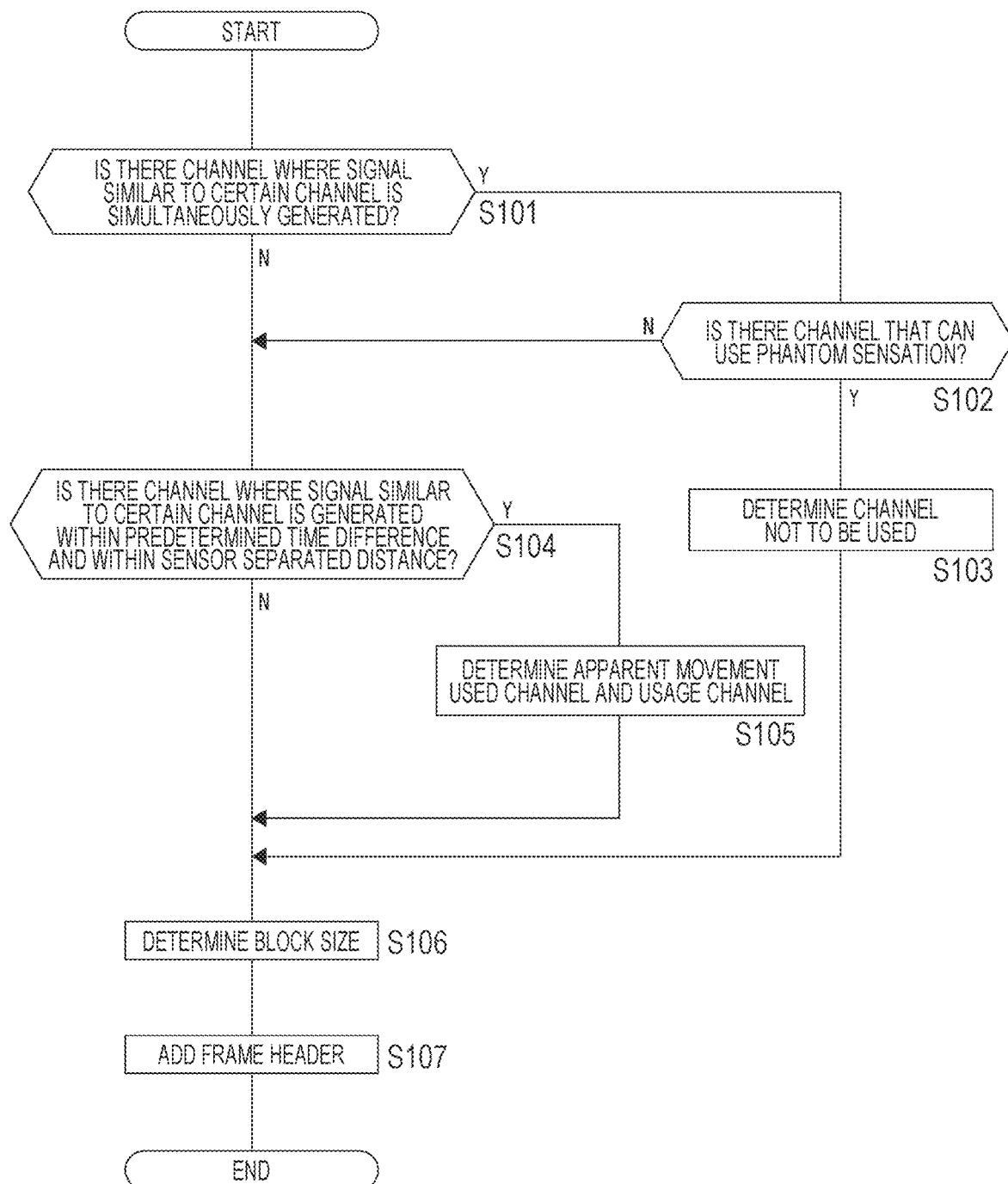
FIG. 14 is a flowchart illustrating a procedure of specific processing for implementing encoding according to an embodiment.

Note that the processing illustrated in FIG. 14 is executed by the encoding unit 24 illustrated in FIG. 2. The processing illustrated in FIG. 14 is executed for each frame described with reference to FIG. 13.

In FIG. 14, in Step S101, the encoding unit 24 determines whether or not there is a channel where a signal similar to a certain channel is simultaneously generated. Specifically, the encoding unit 24 performs analysis of tactile signals of the respective channels that are input via the preprocessing unit 23, at a fixed analysis length, and analyzes whether or not there are simultaneously generated similar waveforms. Whether or not similar waveforms are simultaneously generated is determined by determining whether or not a difference in signal rising time falls within a fixed range. Here, similar waveforms refer to waveforms of signals that have similar time envelopes. In this example, whether or not time envelopes are similar is determined by obtaining a time envelope similarity degree by calculating correlation between signals to be compared, and determining whether or not the time envelope similarity degree is equal to or larger than a predetermined threshold value. Note that the analysis of similarity between time envelopes may be performed by frequency analysis such as fast Fourier transform (FFT).

In a case where it is determined in Step S101 that there is a channel where a signal similar to a certain channel is simultaneously generated, the encoding unit 24 advances the processing to Step S102, in which the encoding unit 24 determines whether or not there is a channel that can use phantom sensation. Specifically, the encoding unit 24 determines whether or not there are three or more channels where similar waveforms are determined to be simultaneously generated, and there are three or more consecutive channels on the surface of arrangement positions of the tactile sensors 5, among these channels.

If there is a channel that can use phantom sensation, the encoding unit 24 advances the processing to Step S103, in which the encoding unit 24 determines a channel not to be used. Specifically, for example, the encoding unit 24 determines, as a channel not to be used, an even-numbered channel among the above-described three or more consecutive channels.

As for the channel determined in Step S103 described above, as a channel not to be used, the encoding unit 24 does not store a channel ID into a region of a channel ID in a frame header in frame header addition processing in Step S107, which will be described later, and does not store a tactile signal in the actual data region.

Therefore, in response to a case where phantom sensation can be used, an information amount of a tactile signal can be efficiently reduced.

Note that the above description has exemplified a method of temporarily excluding a channel that can omit tactile stimulation, from a usage channel, as a reduction method of an information amount that uses phantom sensation, but by allocating zero to an encoding symbol of a tactile signal of the channel, without excluding the channel from a usage channel, an information amount reduction can also be achieved using entropy encoding.

In accordance with executing the processing in Step S103, the encoding unit 24 advances the processing to Step S106 to be described later.

Furthermore, in a case where it is determined in Step S101 that there is no channel where a signal similar to a certain channel is simultaneously generated, or in a case where it is determined in Step S102 that there is no channel that can use phantom sensation, the encoding unit 24 advances the processing to Step S104.

In Step S104, the encoding unit 24 determines whether or not there is a channel where a signal similar to a certain channel is generated within a predetermined time difference and within a sensor separated distance. Here, the sensor separated distance means a separated distance of the tactile sensors 5 between targeted channels.

In Step S104, the encoding unit 24 performs analysis of tactile signals of the respective channels at a fixed analysis length (for example, 2 to 3 seconds or the like), and analyzes whether or not there are similar waveforms generated with a time difference within a predetermined time. Whether or not similar waveforms are generated with a time difference within a predetermined time is determined by determining whether or not a difference in signal rising time falls within a fixed range. Furthermore, similar waveforms are determined by analysis similar to the analysis in Step S101.

In Step S104, on the basis of the above-described analysis, the encoding unit 24 determines whether or not there is a set of channels where similar waveforms are generated with a time difference within a predetermined time, and in a case where there is the set of channels, the encoding unit 24 determines whether or not a sensor separated distance between the channels in the set falls within a predetermined distance.

The encoding unit 24 performs the determination processing in Step S104 by a method of identifying a channel for which a positive result is obtained by the above-described determination, as a "channel where a signal similar to a certain channel is generated within a predetermined time difference and within a sensor separated distance".

By the above-described processing in Step S104, for example, when consecutive tactile stimulation of cutting a body by a sword as exemplified in FIG. 11 is generated, if a generation time length of the tactile stimulation falls within a fixed time length (for example, 2 to 3 seconds), as "channels where a signal similar to a certain channel is generated within a predetermined time difference and within a sensor separated distance", a set of channels of the tactile sensors 5-$h$ and 5-$j$, a set of channels of the tactile sensors 5-$j$ and 5-$l$, a set of channels of the tactile sensors 5-$l$ and 5-$m$, and a set of channels of the tactile sensors 5-$m$ and 5-$n$ are identified.

In a case where it is determined in Step S104 that there is a channel where a signal similar to a certain channel is generated within a predetermined time difference and within a sensor separated distance, the encoding unit 24 advances the processing to Step S105, in which the encoding unit 24 performs determination processing of a used channel and a usage channel of an apparent movement.

In this example, a used channel related to an apparent movement is a channel with the earliest timing of tactile stimulation (channel of the tactile sensor 5-$h$ in the example in FIGS. 11 and 12) among channels determined to be able to use an apparent movement, from the analysis in Step S104 (that is, channels of the tactile sensors 5-$h$, 5-$j$, 5-$l$, 5-$m$, and 5-$n$ in the example in FIGS. 11 and 12). In other words, the used channel is a channel with the earliest signal rising timing.

Furthermore, a usage channel related to an apparent movement is a channel that generates second or subsequent tactile stimulation, among channels determined to be able to use an apparent movement.

Here, frame header addition processing to be performed by the encoding unit 24 varies between a case where a frame to be processed is a frame corresponding to the earliest tactile stimulation timing (hereinafter, described as an "initial frame") among frames in a period of consecutive tactile stimulation that are determined to be able to use an apparent movement, and a case where a frame to be processed is a frame corresponding to a second or subsequent tactile stimulation timing (hereinafter, described as a "non-initial frame").

Specifically, in a case where a frame to be processed is an initial frame, in the frame header addition processing in Step S107, the encoding unit 24 stores a value indicating the above-described channel with the earliest tactile stimulation timing, as a used channel ID in the frame header, and stores an invalid value (that is, a value indicating that there is no applicable value: for example, 0) as a usage channel ID.

On the other hand, in a case where a frame to be processed is a non-initial frame, in the frame header addition processing in Step S107, the encoding unit 24 stores an invalid value (for example, 0) as a used channel ID, and stores a value indicating a channel in which rising of a tactile signal is detected within the period of the frame, among channels determined to be able to use an apparent movement, as a usage channel ID.

Here, in a case where a frame to be processed is a non-initial frame, a tactile signal of a usage channel needs not be stored into the actual data region, and an information amount reduction can be achieved by employing a method of excluding the usage channel from a usage channel, for example. Alternatively, an information amount reduction can also be achieved by using entropy encoding by allocating zero to an encoding symbol of a tactile signal in a usage channel.

In a case where the encoding unit 24 executes the determination processing in Step S105, or in a case where it is determined in Step S104 that there is no channel where a signal similar to a certain channel is generated within a predetermined time difference and within a sensor separated distance, the encoding unit 24 advances the processing to Step S106.

Figure 15:
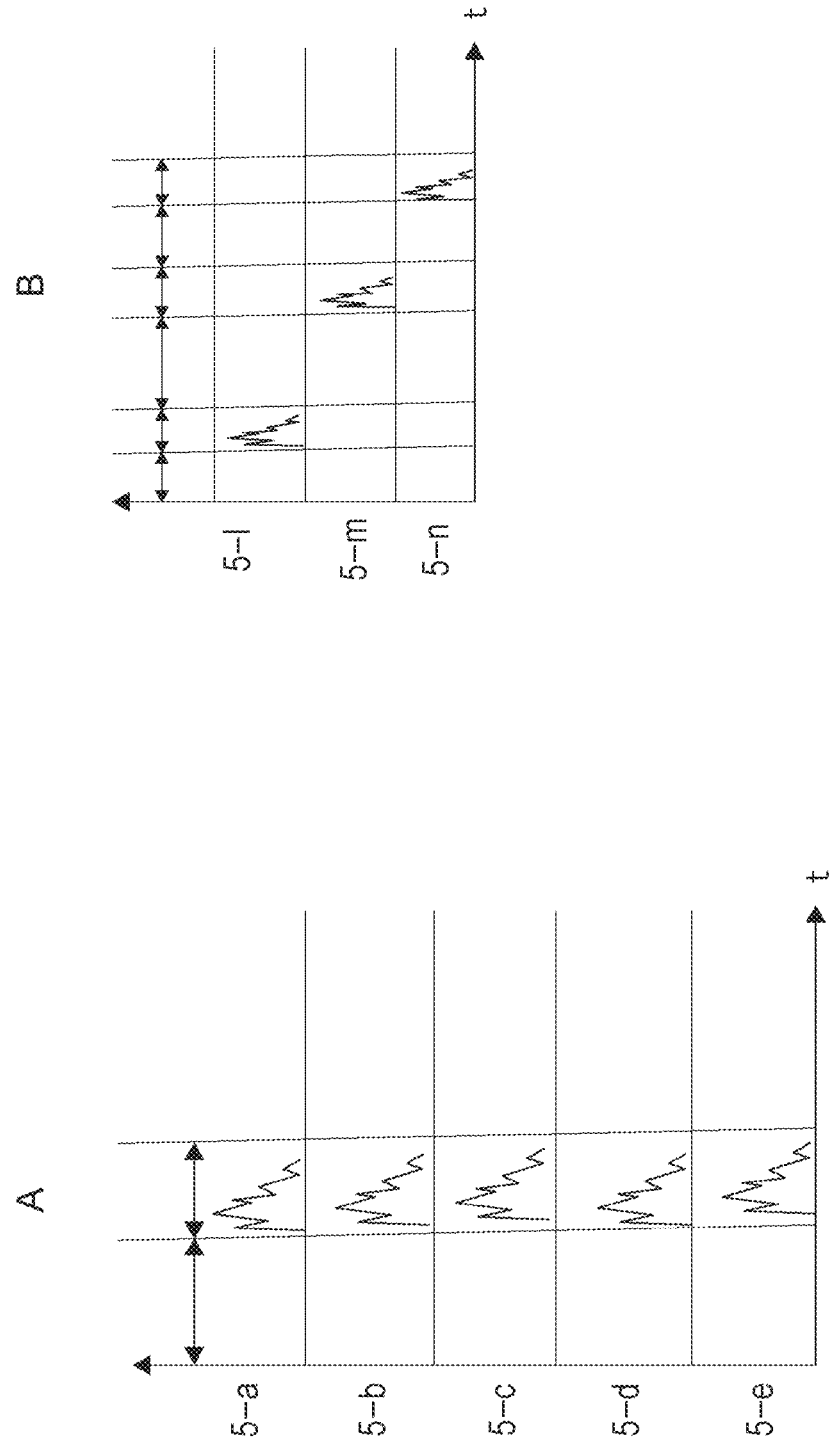
FIG. 15 is a diagram illustrating an example of block size determination.

In Step S106, the encoding unit 24 performs block size determination processing. On the basis of the result of the waveform analysis in Step S101 or S104, a block size is determined in such a manner that the rising of a signal comes to the beginning of a frame. Specifically, when phantom sensation is used, for example, a range indicated by a double-headed arrow in un upper part of FIG. 15A is set as a block size. Furthermore, in the case of an apparent movement, for example, a range indicated by a double-headed arrow in un upper part of FIG. 15B is set as a block size.

Note that FIGS. 15A and 15B illustrate an example in which a period of one tactile stimulation is fitted within one block, but a period of one tactile stimulation can also be fitted within a plurality of blocks in a divided manner.

In FIG. 14, in accordance with executing the block size determination in Step S106, the encoding unit 24 executes the frame header addition processing in Step S107. Note that, because the details of the frame header addition processing to be executed when phantom sensation is used, and when an apparent movement is used have already been described, the redundant description will be omitted.

In accordance with executing the processing in Step S107, the encoding unit 24 ends the series or processes illustrated in FIG. 14.

(Functional Configuration and Processing Procedure on Decoding Side)

Subsequently, decoding of a tactile signal encoded by the above-described method will be described.

Figure 16:
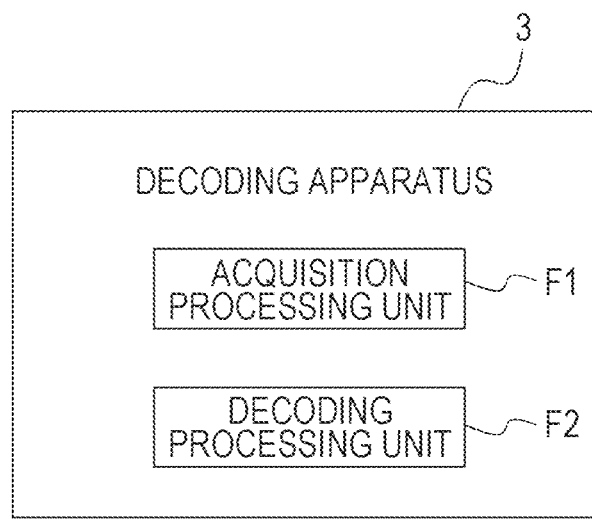
FIG. 16 is a functional block diagram for describing a function related to decoding that is included in a decoding apparatus according to an embodiment.

FIG. 16 is a functional block diagram for describing a function related to decoding that is included in the decoding apparatus 3.

As illustrated in the drawing, the decoding apparatus 3 includes functions as an acquisition processing unit F1 and a decoding processing unit F2.

The acquisition processing unit F1 acquires the tactile coded data Dc obtained by performing encoding of compressing an information amount, on a tactile signal using higher-order perception in a tactile sense. In this example, the function of the acquisition processing unit F1 corresponds to a function of the wireless communication unit 36 receiving the tactile coded data Dc from the reproduction apparatus 4 side.

The decoding processing unit F2 decodes the tactile coded data Dc acquired by the acquisition processing unit F2. The function of the acquisition processing unit F2 is implemented by the decoding unit 34.

In this example, the acquisition processing unit F1 acquires the tactile coded data Dc having been subjected to encoding of compressing an information amount using phantom sensation or an apparent movement.

In a case where phantom sensation is used, the acquisition processing unit F1 acquires the tactile coded data Dc including usage channel designation information (usage channel ID in this example) for designating a usage channel from among three or more channels of tactile signals. Then, the decoding processing unit F2 outputs a tactile signal of a channel indicated by the usage channel designation information.

Therefore, in implementing a data amount reduction that uses phantom sensation, the decoding apparatus 3 needs not perform processing such as processing of determining whether or not phantom sensation is used, by analyzing coded data, and is only required to perform simple processing of outputting a tactile signal in accordance with usage channel designation information included in tactile coded data.

Furthermore, in a case where an apparent movement is used, the acquisition processing unit F1 acquires the tactile coded data Dc including usage presence/absence information indicating usage presence/absence of an apparent movement, and the decoding processing unit F2 decodes the tactile coded data Dc on the basis of the usage presence/absence information. In this example, information regarding an apparent movement used channel ID and an apparent movement usage channel ID in a frame header correspond to the usage presence/absence information.

As described above, in an initial frame among frames in a period of consecutive tactile stimulation that are determined to be able to use an apparent movement, because a valid value is stored as the apparent movement used channel ID and an invalid value is stored as the apparent movement usage channel ID, on the basis of the information regarding the apparent movement used channel ID and the apparent movement usage channel ID, the decoding processing unit F2 can identify that a channel serving as a used channel exists in the frame, and can identify a channel ID of a used channel.

Furthermore, in a frame corresponding to a second or subsequent tactile stimulation timing, among frames in a period of consecutive tactile stimulation that are determined to be able to use an apparent movement, because an invalid value is stored as the apparent movement used channel ID and a valid value is stored as the apparent movement usage channel ID, on the basis of the information regarding the apparent movement used channel ID and the apparent movement usage channel ID, the decoding processing unit F2 can identify that a channel that is to use a waveform portion of a used channel in the initial frame exists in the frame, and can identify a channel ID of a channel of which the waveform portion is to be used (to be output).

Furthermore, in a case where an apparent movement is used, the acquisition processing unit F1 acquires the tactile coded data Dc including a tactile signal of only a single channel among usable channels of an apparent movement, and output control information indicating an output channel and an output timing of the tactile signal, and the decoding processing unit F2 outputs the tactile signal of the single channel in accordance with the output control information.

In this example, information regarding an apparent movement used channel ID and an apparent movement usage channel ID in a frame header correspond to the output control information. Information regarding the apparent movement usage channel ID functions as information indicating an output channel and an output timing of a tactile signal in an apparent movement used channel of an initial frame, by a valid value being stored in an appropriate frame.

A specific processing procedure to be executed for implementing the above-described decoding function according to an embodiment will be described with reference to a flowchart in FIG. 17.

Figure 17:
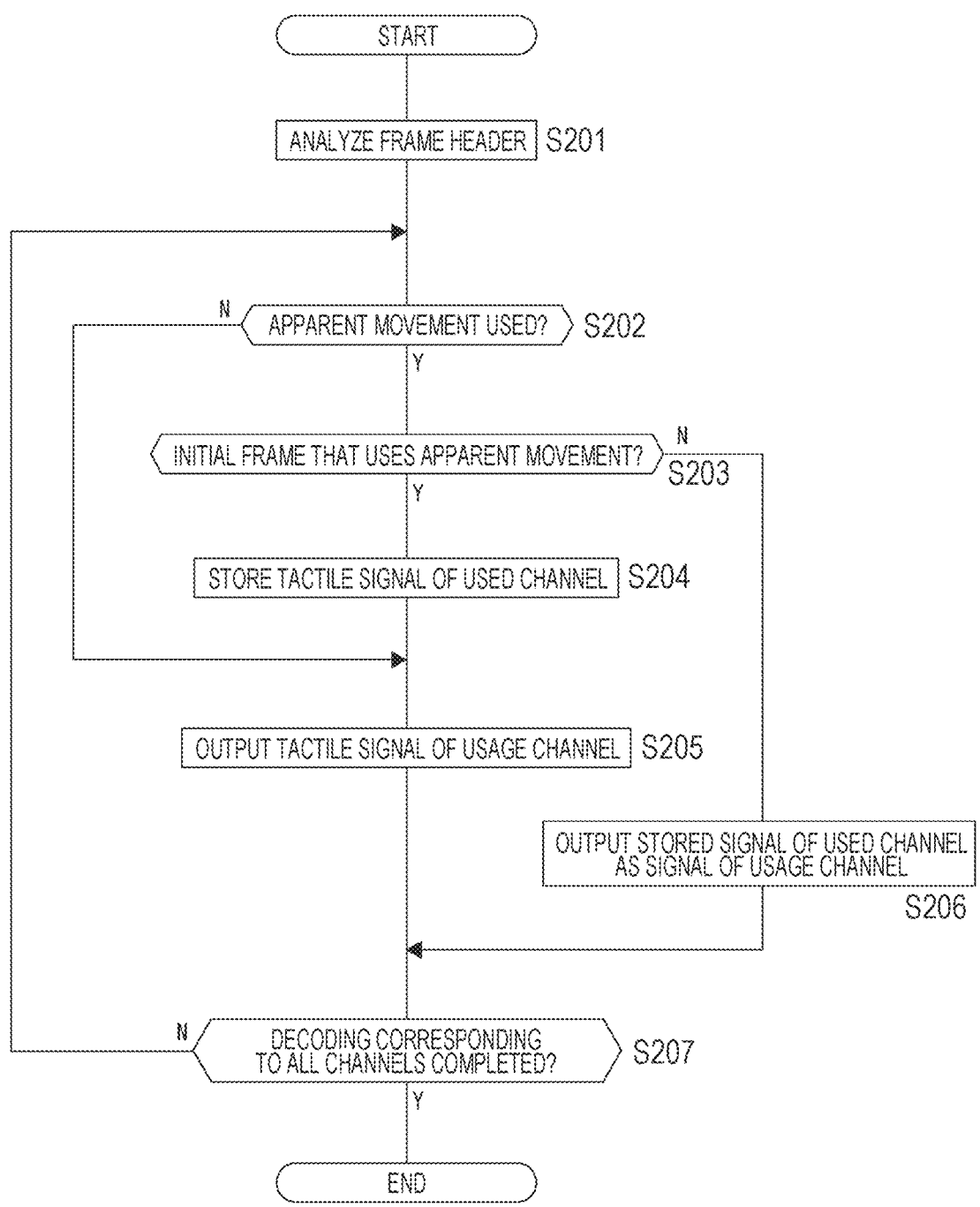
FIG. 17 is a flowchart illustrating a specific processing procedure to be executed for implementing a decoding function according to an embodiment.

Note that the processing illustrated in FIG. 17 is executed by the decoding unit 34 for each frame of the tactile coded data Dc.

First of all, in Step S201, the decoding unit 34 executes the frame header analysis processing, and in following Step S202, the decoding unit determines whether or not an apparent movement is used. Specifically, the decoding unit 34 determines whether or not a valid value is stored in at least either of the apparent movement used channel ID and the apparent movement usage channel ID.

In a case where it is determined that a condition that a valid value is stored in at least either of the apparent movement used channel ID and the apparent movement usage channel ID is not satisfied, and an apparent movement is not used, the decoding unit 34 advances the processing to Step S205, in which the decoding unit 34 executes processing of outputting a tactile signal of a usage channel. Therefore, in response to a case where a frame to be processed is a frame unrelated to the use of phantom sensation or an apparent movement, or a case where a frame to be processed is a frame related to the use of phantom sensation, a tactile signal of a usage channel indicated by a usage channel ID is output.

In accordance with executing the output processing in Step S205, the decoding unit 34 advances the processing to Step S207 to be described later.

On the other hand, in a case where it is determined in Step S202 that an apparent movement is used, the decoding unit 34 advances the processing to Step S203, in which the decoding unit 34 determines whether or not a corresponding frame is an initial frame that uses an apparent movement. Specifically, the decoding unit 34 determines whether or not a valid value is stored only in the former of the apparent movement used channel ID and the apparent movement usage channel ID.

In a case where it is determined that a valid value is stored only in the apparent movement used channel ID, and a corresponding frame is an initial frame that uses an apparent movement, the decoding unit 34 advances the processing to Step S204, in which the decoding unit 34 executes processing of storing a tactile signal of a used channel, and then, the decoding unit 34 advances the processing to Step S205.

Note that, by executing the processing in Step S205 after executing the processing in Step S204, in the initial frame, a tactile signal of a used channel is output.

Furthermore, in a case where it is determined in Step S203 that a condition that a valid value is stored only in the apparent movement used channel ID is not satisfied, and a corresponding frame is not an initial frame that uses an apparent movement, the decoding unit 34 advances the processing to Step S206. Note that a case where a negative result is obtained in Step S203 can be said to be a case where a valid value is stored only in the apparent movement usage channel ID out of the apparent movement used channel ID and the apparent movement usage channel ID.

In Step S206, the decoding unit 34 performs processing of outputting a stored tactile signal of a used channel as a signal of a usage channel, and advances the processing to Step S207.

In Step S207, the decoding unit 34 determines whether or not decoding corresponding to all channels has been completed. In a case where a negative result is obtained, the processing returns to Step S202, and in a case where a positive result is obtained, the series of processes illustrated in this drawing is ended.

By the above-described decoding processing, it is possible to appropriately decode the tactile coded data Dc having been subjected to encoding of compressing an information amount using higher-order perception, and appropriately perform reproduction of tactile information sensed in the recording environment, using higher-order perception.

1-6. Modified Example of First Embodiment

The above description has been given of an example of sensing a tactile signal using the tactile sensor 5, but a tactile signal may be a signal obtained on the basis of a voice signal.

For example, a signal obtained by performing low-pass filter (LPF) processing on a voice signal with a sampling frequency of 48 kHz may be used.

Figure 18:
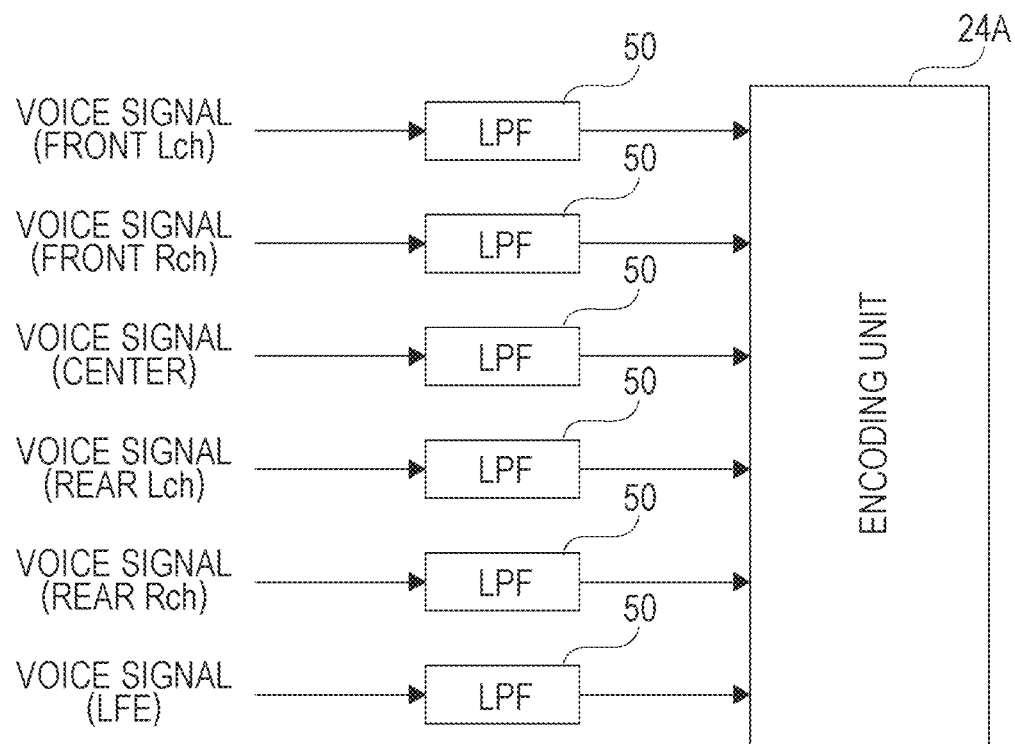
FIG. 18 is a diagram for describing a configuration example of an encoding apparatus according to a modified example of the first embodiment.

FIG. 18 exemplifies a configuration on an encoding side in a case where a tactile signal is obtained on the basis of a voice signal.

FIG. 18 exemplifies a configuration corresponding to a case where a voice signal is assumed to be a voice signal of 5.1 channel surround, for example. As illustrated in the drawing, an LPF 50 is prepared for each channel of a voice signal, and tactile signals of the respective channels are obtained by extracting low-pass components (for example, 2 kHz or less) from voice signals by these LPFs 50. An encoding unit 24A obtains the tactile coded data Dc by performing encoding processing similar to the encoding unit 24, on the tactile signals of the respective channels that are obtained by these LPFs 50.

For example, in the case of content in which a stereotactic position of a sound source can spatially move, such as surround content of 5.1 channel, 7.1 channel, or the like, it is possible to reproduce a feeling of moving between different regions of a human body, such as a feeling of moving between fingers as a pseudo movement, or a feeling of moving from the breast to the belly as a pseudo movement.

In this case, the decoding apparatus 3 acquires the tactile coded data Dc obtained by the encoding unit 24A, and the decoding unit 34 performs decoding processing similar to FIG. 17 on the acquired tactile coded data Dc.

2. SECOND EMBODIMENT

2-1. Overview of Tactile Reproduction System

Subsequently, a tactile reproduction system 1B of a second embodiment will be described.

The second embodiment can make a criterion for determining whether or not higher-order perception is used, variable in accordance with an individual difference in sensitivity related to higher-order perception.

Figure 19:
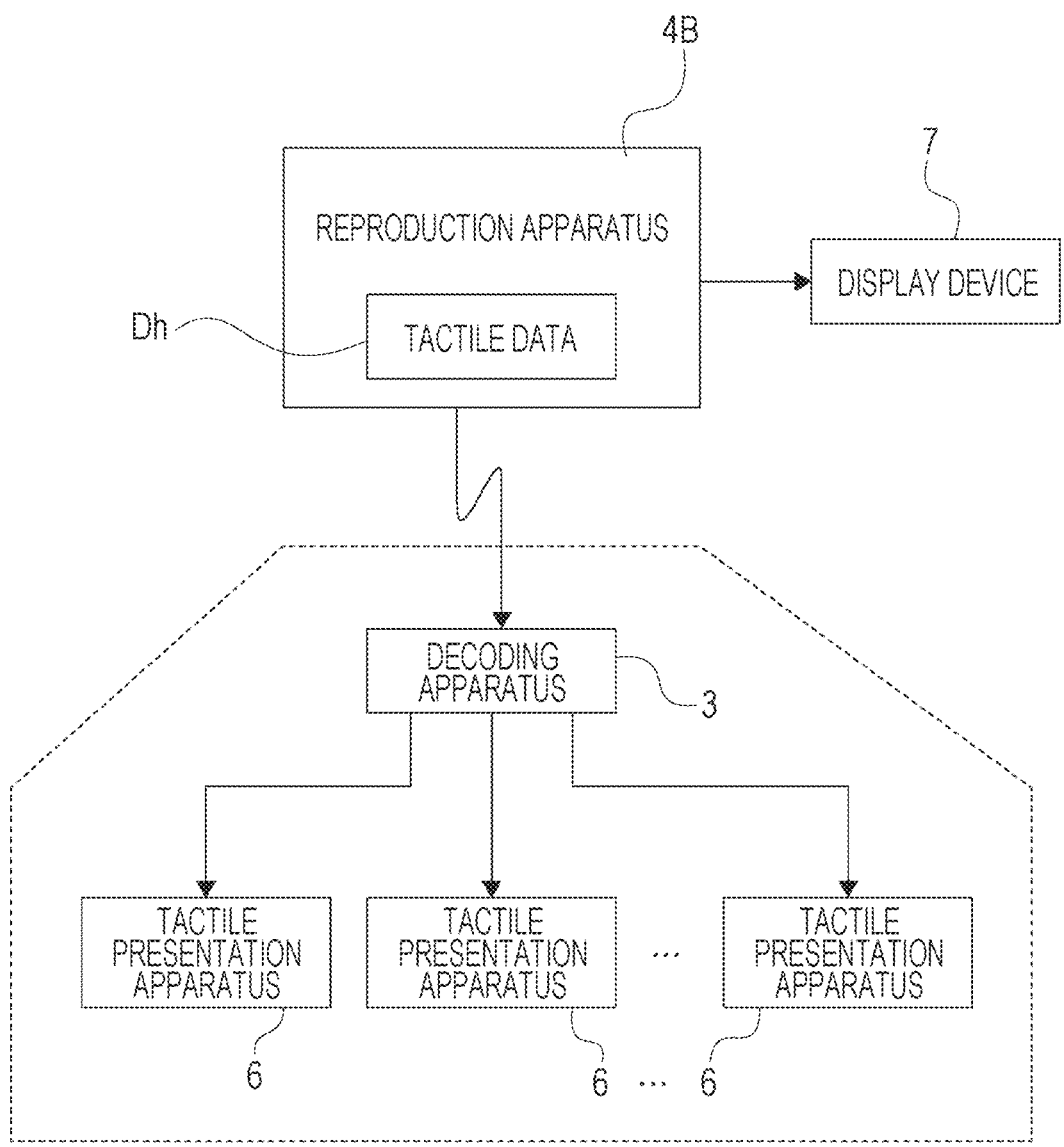
FIG. 19 is a diagram illustrating a configuration example of a tactile reproduction system according to a second embodiment.

FIG. 19 is a diagram illustrating a configuration example of the tactile reproduction system 1B.

Note that, in the following description, parts similar to already-described parts are assigned the same reference numerals, and the description will be omitted.

The tactile reproduction system 1B includes a reproduction apparatus 4B, the decoding apparatus 3, a plurality of tactile presentation apparatuses 6 (at least three or more also in this example), and a display device 7.

The reproduction apparatus 4B is configured to acquire tactile data Dh. The tactile data Dh indicates a tactile signal of each channel that is converted into digital data. In this example, the tactile data Dh indicates a tactile signal before being subjected to encoding according to an embodiment, that is, encoding of compressing an information amount using higher-order perception.

The reproduction apparatus 4B is configured to perform encoding according to an embodiment on the tactile data Dh, and transmit the tactile coded data Dc obtained by the encoding, to the decoding apparatus 3 by wireless communication.

Furthermore, the display device 7 serving as a display device such as a liquid crystal display (LCD) or an organic electro-luminescence (EL) display, for example, is connected to the reproduction apparatus 4B, and the reproduction apparatus 4B is configured to display various types of information on the display device 7.

2-2. Configuration of Reproduction Apparatus

Figure 20:
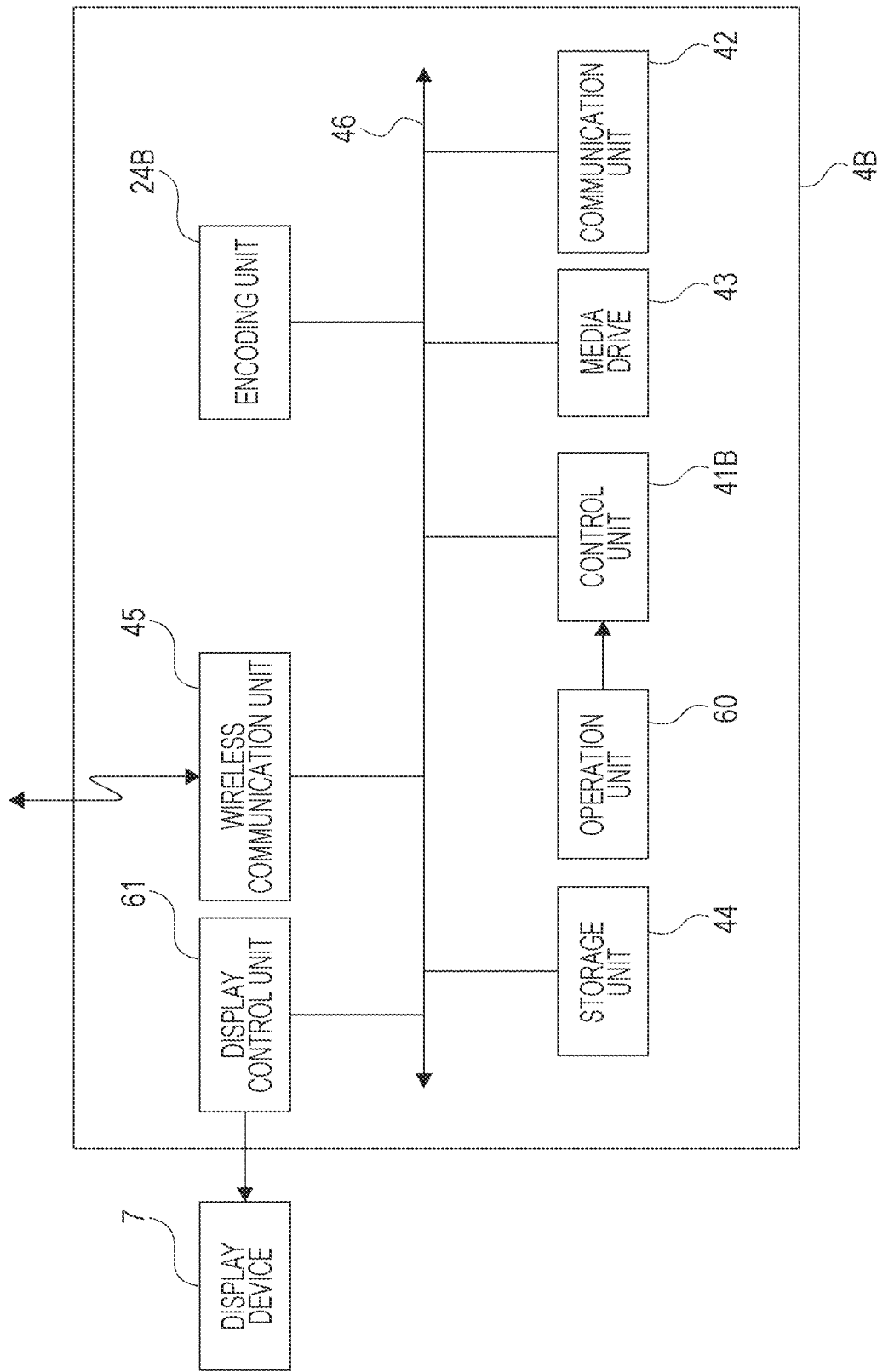
FIG. 20 is a diagram for describing an inner configuration example of a reproduction apparatus according to the second embodiment.

FIG. 20 is a diagram for describing an inner configuration example of the reproduction apparatus 4B, and illustrates the display device 7 together with the inner configuration example of the reproduction apparatus 4B.

The reproduction apparatus 4B is different from the reproduction apparatus 4 illustrated in FIG. 3 in that a control unit 41B is provided in place of the control unit 41, and an encoding unit 24B, an operation unit 60, and a display control unit 61 are added.

The reproduction apparatus 4B can acquire the tactile data Dh via the media drive 43 or by communication via the communication unit 42.

The encoding unit 24B inputs the tactile data Dh, that is to say, a tactile signal of each channel, and obtains the tactile coded data Dc by performing encoding processing according to an embodiment.

The encoding unit 24B is different from the encoding unit 24 in that the encoding unit 24B can change a criterion for determining whether or not to perform encoding that uses phantom sensation, and a criterion for determining whether or not to perform encoding that uses an apparent movement.

As seen from the above description, in the embodiment, determination as to whether or not phantom sensation can be used is performed by determining whether or not a condition that a similarity degree of time envelope waveforms of tactile signals between channels to be compared is equal to or larger than a predetermined threshold value, and a condition that a difference between rising times of the tactile signals is equal to or smaller than a predetermined threshold value are satisfied. Furthermore, determination as to whether or not an apparent movement can be used is also performed by determining whether or not a condition that a similarity degree of the time envelope waveforms between channels to be compared is equal to or larger than a predetermined threshold value, and a condition that a difference between the rising times is equal to or smaller than a predetermined threshold value are satisfied.

The encoding unit 24B of this example is configured to change at least a threshold value of the above-described similarity degree of time envelope waveforms, and a threshold value of a difference between signal rising times, as a criterion for determining whether or not to perform encoding that uses phantom sensation, and a criterion for determining whether or not to perform encoding that uses an apparent movement.

The operation unit 60 comprehensively represents various operational tools provided in the reproduction apparatus 4B, and outputs operation input information corresponding to an operation input, to the control unit 41B.

The control unit 41B includes a microcomputer including, for example, a CPU, a ROM, a RAM, and the like, and controls the entire reproduction apparatus 4B by executing processing in accordance with a program stored in the above-described ROM or the like.

Note that processing according to an embodiment that is to be executed by the control unit 41B will be described below.

The display control unit 61 is connected to the bus 46, and performs display control of the display device 7 on the basis of an instruction from the control unit 41B. The control unit 41B can thereby display various types of information on the display device 7.

2-3. Encoding Method

In the second embodiment, a criterion for determining whether or not to perform encoding that uses phantom sensation or an apparent movement is changed in such a manner that it becomes easier to perform the encoding that uses phantom sensation or an apparent movement, as it is easier to perceive phantom sensation or an apparent movement.

Here, a criterion for determining whether or not to perform encoding that uses phantom sensation or an apparent movement corresponds to a threshold value of the above-described similarity degree of time envelope waveforms and a threshold value of a difference between signal rising times. In the following description, these threshold values will be collectively referred to as a "higher-order perception applied threshold value".

Various methods can be considered as a method of defining a higher-order perception applied threshold value in accordance with sensitivity of a recipient that is related to higher-order perception. Here, as an example, the description will be given of a method of probatively applying tactile stimulation to a recipient, estimating a sensitivity related to higher-order perception in accordance with a response to the tactile stimulation from the recipient, and defining a higher-order perception applied threshold value in accordance with the estimated sensitivity.

Figure 21:
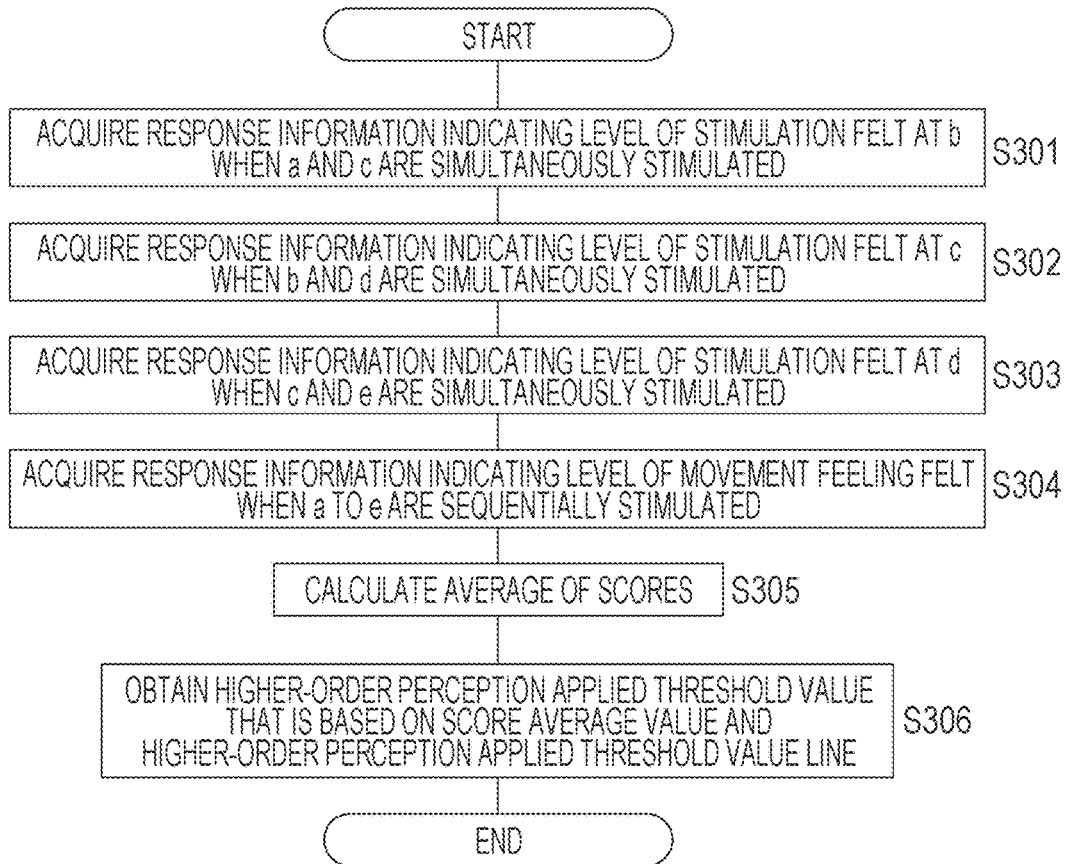
FIG. 21 is a flowchart illustrating a specific processing procedure to be executed for implementing an encoding method according to the second embodiment.

FIG. 21 is a flowchart illustrating a specific processing procedure to be executed for implementing an encoding method according to the second embodiment.

Note that the processing illustrated in FIG. 21 is executed by the control unit 41B in this example.

Here, the description will be given of processing corresponding to a case where the finger contact type tactile device illustrated in FIG. 6 is used as a tactile device, and "a" to "e" in the drawing indicate the respective positions of the tactile device that are illustrated in FIG. 6.

First of all, in Steps S301 to S303, the control unit 41B executes processing for acquiring response information indicating levels of stimulation respectively felt at the points b, c, and d when the points a and c, the points b and d, and the points c and e are simultaneously stimulated.

The processing in Steps S301 to S303 is executed as processing of issuing an instruction to simultaneously drive the tactile presentation apparatuses 6 at corresponding positions, to the decoding apparatus 3 side via the wireless communication unit 45, displaying a reception screen of response information on the display device 7, and receiving an operation input on the operation unit 60. At this time, a drive signal of the tactile presentation apparatus 6 is a pulse signal with fixed intensity.

The response information in this case is assumed to be information regarding a score indicating a level of phantom sensation felt by the recipient in three stages (1: stimulation is not felt between stimulated fingers/2: felt/3: strongly felt, etc.).

In Step S304 following Step S303, the control unit 41B executes processing for obtaining response information indicating a level of a movement feeling felt when the points a to e are sequentially stimulated.

The processing is executed as processing of issuing an instruction to sequentially drive the tactile presentation apparatuses 6 at corresponding positions, to the decoding apparatus 3 side via the wireless communication unit 45, displaying a reception screen of response information on the display device 7, and receiving an operation input on the operation unit 60.

The response information in this case is assumed to be information regarding a score indicating a level of an apparent movement felt by the recipient in three stages (1: movement feeling is not felt/2: felt/3: strongly felt, etc.).

In Step S305 following Step S304, the control unit 41B calculates an average of the scores obtained in Steps S301 to S304 as response information, and in Step S306, performs processing of obtaining a higher-order perception applied threshold value that is based on the score average value and a higher-order perception applied threshold value line.

Figure 22:
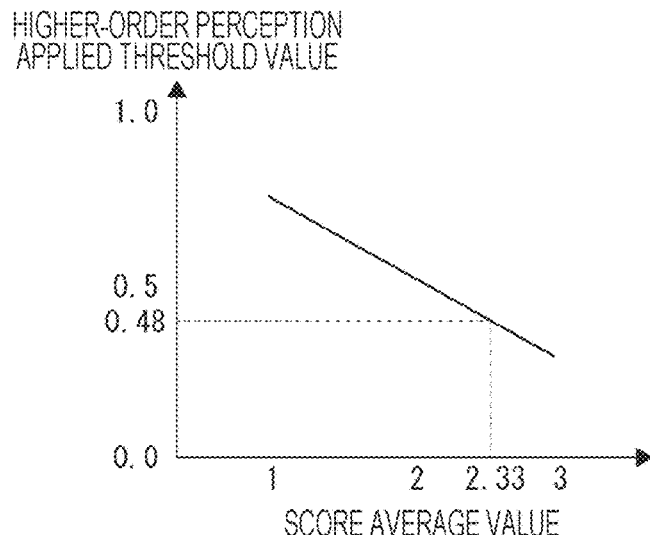
FIG. 22 is a diagram illustrating an example of a higher-order perception applied threshold value line.

FIG. 22 illustrates an example of a higher-order perception applied threshold value line.

FIG. 22 exemplifies a higher-order perception applied threshold value line corresponding to a case where a higher-order perception applied threshold value is a threshold value of the above-described similarity degree of time envelope waveforms.

As illustrated in the drawing, the higher-order perception applied threshold value line in this case represents a smaller higher-order perception applied threshold value as a score average value becomes higher. In other words, the higher-order perception applied threshold value line is designed in such a manner that a threshold value of the similarity degree of time envelope waveforms becomes lower as a sensitivity related to higher-order perception becomes higher, and it becomes easier to perform information compression that uses higher-order perception, as a sensitivity related to higher-order perception becomes higher. According to the higher-order perception applied threshold value line exemplified in the drawing, 0.48 is obtained as a higher-order perception applied threshold value when a score average value is 2.33.

Note that, in a case where a higher-order perception applied threshold value is a threshold value of a difference between signal rising times, the higher-order perception applied threshold value line is only required to be inversely designed in such a manner that a higher-order perception applied threshold value becomes smaller as the score average value becomes higher.

By performing the above-described processing, it becomes possible to efficiently reduce a data amount of a tactile signal in accordance with a sensitivity of a recipient that is related to higher-order perception.

Note that the above description has been given of an example of setting a common higher-order perception applied threshold value between phantom sensation and an apparent movement, but different threshold values may be set for phantom sensation and an apparent movement as higher-order perception applied threshold values.

Here, as recipients, users with different preferences are assumed to exist. For example, some users desire to prevent transfer interruption even if the quality of a tactile signal is deteriorated. In contrast, the other users place importance on the quality of a tactile signal even if transfer interruption is caused to some extent. It is considered to provide a structure of enabling the users to adjust a higher-order perception applied threshold value by themselves.

FIG. 23 is a diagram illustrating an example of a graphical user interface (GUI) for adjusting a higher-order perception applied threshold value. Specifically, FIG. 23 illustrates an example of an image displayed on a display screen 7a of the display device 7 for the adjustment of a higher-order perception applied threshold value.

In FIG. 21 described above, a term "higher-order perception applied threshold value" is used. In FIG. 23, an index indicating easiness of application of encoding that uses higher-order perception is represented as an "applied threshold value" for each combination of targeted fingers. That is, while a sensitivity of a user that is related to higher-order perception is preliminarily surveyed and a threshold value is defined in FIG. 21, in FIG. 23, the user can define an applied threshold value in accordance with the preference of the user. In the example in FIG. 23, the GUI enables adjustment of an applied threshold value for each of phantom sensation and an apparent movement.

By setting a low applied threshold value, the user can cause information compression that uses higher-order perception, to be performed more frequently, and can achieve transfer interruption prevention and power saving. In contrast, by setting a high applied threshold value, the use can cause information compression that uses higher-order perception, to be hardly performed, and prevent a decline in accuracy of tactile reproduction as far as possible.

Furthermore, the GUI in FIG. 23 enables adjustment of an applied threshold value for the respective combinations of fingers between the points a and c, between the points b and d, and between the points c and e, as for an applied threshold value of phantom sensation. Therefore, for example, a user who recognizes that a feeling of an index finger is keen but feelings of the other fingers are not so keen can prevent impairment of tactile information of a keen index finger, and achieve a reduction in a data amount by compressing information regarding the other fingers, by setting a high phantom sensation applied threshold value between the points a and c, and setting low applied threshold values for the other combinations.

3. CONCLUSION OF EMBODIMENT

As described above, a decoding apparatus (decoding apparatus 3) according to an embodiment includes a decoding unit (the decoding processing unit F2, the decoding unit 34) that decodes tactile coded data obtained by performing encoding of compressing an information amount, on a tactile signal using higher-order perception in a tactile sense.

Therefore, a data amount reduction of a tactile signal can be performed in accordance with a tactile characteristic of a human.

Thus, a tactile reproduction system can be made more efficient by achieving a data amount reduction of a tactile signal while ensuring reproducibility of a tactile sense.

Furthermore, if higher-order perception is used, because output of a tactile signal can be made unnecessary as for a channel (region) of which a tactile signal is originally to be output, a reduction in the number of tactile presentation apparatuses to be driven is achieved, and power saving and durability enhancement of tactile presentation apparatuses can be achieved.

Furthermore, in the decoding apparatus according to an embodiment, the decoding unit decodes tactile coded data having been subjected to encoding of compressing an information amount using phantom sensation.

Therefore, in response to a case where similar tactile stimulation is to be simultaneously applied to three or more regions of a human body, a data amount reduction can be performed in accordance with a tactile characteristic of a human.

Thus, a tactile reproduction system can be made more efficient by achieving a data amount reduction of a tactile signal while ensuring reproducibility of a tactile sense.

Moreover, in the decoding apparatus according to an embodiment, the tactile coded data includes usage channel designation information for designating a usage channel from among three or more channels of tactile signals, and the decoding unit outputs a tactile signal of a channel indicated by the usage channel designation information.

Therefore, in implementing a data amount reduction that uses phantom sensation, the decoding apparatus needs not perform processing such as processing of determining whether or not phantom sensation is used, by analyzing a tactile signal, and is only required to perform simple processing of outputting a tactile signal in accordance with usage channel designation information included in tactile coded data.

Thus, in enhancing efficiency of a tactile reproduction system, a reduction in processing burden on the decoding apparatus and cost reduction attributed to simplification of a configuration can be achieved.

Moreover, furthermore, in the decoding apparatus according to an embodiment, the decoding unit decodes tactile coded data having been subjected to encoding of compressing an information amount using an apparent movement.

Therefore, in response to a case where similar tactile stimulation is to be sequentially applied to different regions of a human body, a data amount reduction can be performed in accordance with a tactile characteristic of a human.

Thus, a tactile reproduction system can be made more efficient by achieving a data amount reduction of a tactile signal while ensuring reproducibility of a tactile sense.

Furthermore, in the decoding apparatus according to an embodiment, the tactile coded data includes usage presence/absence information indicating usage presence/absence of an apparent movement, and the decoding unit decodes the tactile coded data on the basis of the usage presence/absence information.

Therefore, in implementing a data amount reduction that uses an apparent movement, the decoding apparatus needs not perform processing such as processing of determining whether or not an apparent movement is used, by analyzing a tactile signal, and is only required to perform simple processing of outputting a tactile signal in accordance with usage presence/absence information included in tactile coded data.

Thus, in enhancing efficiency of a tactile reproduction system, a reduction in processing burden on the decoding apparatus and cost reduction attributed to simplification of a configuration can be achieved.

Moreover, in the decoding apparatus according to an embodiment, the tactile coded data includes a tactile signal of only a single channel among usable channels being channels of tactile signals that can use an apparent movement, and output control information indicating an output channel and an output timing of the tactile signal, and the decoding unit outputs the tactile signal of the single channel in accordance with the output control information.

Therefore, in implementing tactile reproduction that uses an apparent movement, tactile coded data needs not include a tactile signal of each channel to which tactile stimulation is to be applied, and it is sufficient that a tactile signal of a single channel is included.

Thus, further reduction in a data amount of a tactile signal can be achieved, and a tactile reproduction system can be made further efficient.

Moreover, furthermore, in the decoding apparatus according to an embodiment, the single channel is a channel with the earliest signal rising timing among signals of the usable channels.

Therefore, in applying earliest tactile stimulation among sequential tactile stimulation related to an apparent movement, it becomes unnecessary to stand by until a tactile signal indicating second or subsequent tactile stimulation is acquired.

Thus, in implementing tactile reproduction that uses an apparent movement, using only a tactile signal of a single channel, it is possible to prevent latency from being unnecessarily generated.

Furthermore, in the decoding apparatus according to an embodiment, the decoding unit decodes tactile coded data in which a size of a block indicating a processing unit in the time direction is made variable.

Therefore, as for a tactile signal serving as a time signal, a specific waveform portion and other portions can be treated as data including different blocks.

Thus, when only a specific waveform portion of a tactile signal is desired to be targeted as in the case of using the above-described phantom sensation or apparent movement, in the decoding apparatus, it becomes unnecessary to perform processing of extracting the waveform portion from the tactile signal by signal analysis, and a reduction in processing burden related to decoding of a tactile signal encoded using higher-order perception can be achieved.

Moreover, in the decoding apparatus according to an embodiment, a tactile signal is a signal that is based on a detection signal of a tactile sensor.

Therefore, tactile reproduction can be performed on the basis of actually-sensed tactile information.

Thus, reproducibility of a tactile sense can be enhanced.

Moreover, furthermore, in the decoding apparatus according to an embodiment, a tactile signal is a signal that is based on a voice signal.

Therefore, tactile information having high association with voice information can be reproduced.

Thus, tactile reproduction with a high entertainment property can be implemented in tandem with a change in voice information by changing a region to which tactile stimulation is applied, in accordance with a change in a stereotactic position of a sound source, for example.

Furthermore, a decoding method according to an embodiment is a decoding method of decoding tactile coded data obtained by performing encoding of compressing an information amount, on a tactile signal using higher-order perception in a tactile sense.

Also according to such a decoding method according to an embodiment, functions and effects that are similar to those of the above-described decoding apparatus according to an embodiment can be obtained.

Here, the functions of the encoding unit (24, 24A, 24B) and the decoding unit (34) that have been described so far can be implemented as software processing performed by a CPU and the like. The software processing is executed on the basis of a program, and the program is stored in a storage device from which programs can be read out by a computer device (information processing device) such as the CPU.

A program according to an embodiment is a program for causing an information processing device to implement a function of decoding tactile coded data obtained by performing encoding of compressing an information amount, on a tactile signal using higher-order perception in a tactile sense.

According to such a program, the above-described decoding apparatus according to an embodiment can be implemented.

Note that effects described in this specification are mere exemplifications and are not limited, and other effects may be caused.

4. PRESENT TECHNOLOGY

Note that the present technology can also employ the following configurations.

(1)

A decoding apparatus including:

a decoding unit configured to decode tactile coded data obtained by performing encoding of compressing an information amount, on a tactile signal using higher-order perception in a tactile sense.

(2)

The decoding apparatus according to (1) described above, in which the decoding unit decodes the tactile coded data having been subjected to encoding of compressing an information amount using phantom sensation.

(3)

The decoding apparatus according to (2) described above, in which the tactile coded data includes usage channel designation information for designating a usage channel from among three or more channels of tactile signals, and the decoding unit outputs a tactile signal of a channel indicated by the usage channel designation information.

(4)

The decoding apparatus according to any of (1) to (3) described above, in which the decoding unit decodes the tactile coded data having been subjected to encoding of compressing an information amount using an apparent movement.

(5)

The decoding apparatus according to (4) described above, in which the tactile coded data includes usage presence/absence information indicating usage presence/absence of an apparent movement, and the decoding unit decodes the tactile coded data on the basis of the usage presence/absence information.

(6)

The decoding apparatus according to (5) described above, in which the tactile coded data includes a tactile signal of only a single channel among usable channels being channels of tactile signals that can use an apparent movement, and output control information indicating an output channel and an output timing of the tactile signal, and the decoding unit outputs the tactile signal of the single channel in accordance with the output control information.

(7)

The decoding apparatus according to (6) described above, in which the single channel is a channel with an earliest signal rising timing among signals of the usable channels.

(8)

The decoding apparatus according to any of (1) to (7) described above, in which the decoding unit decodes the tactile coded data in which a size of a block indicating a processing unit in a time direction is made variable.

(9)

The decoding apparatus according to any of (1) to (8) described above, in which the tactile signal is a signal that is based on a detection signal of a tactile sensor.

(10)

The decoding apparatus according to any of (1) to (8) described above, in which the tactile signal is a signal that is based on a voice signal.

REFERENCE SIGNS LIST

1, 1B Tactile reproduction system
2 Encoding apparatus
3 Decoding apparatus
4, 4B Reproduction apparatus
5 Tactile sensor
6 Tactile presentation apparatus
7 Display device
7a Display screen
Dc Coded data
24, 24A, 24B Encoding unit
34 Decoding unit
36 Wireless communication unit
F1 Acquisition processing unit
F2 Decoding processing unit
LPF (low-pass filter)
Dh Tactile data
60 Operation unit

The invention claimed is:

1. A decoding apparatus comprising:

a decoding unit configured to decode tactile coded data obtained by performing encoding of compressing an information amount, on a tactile signal using higher-order perception in a tactile sense, wherein the tactile coded data includes header information having a header format comprising a used channel ID of a channel of which the tactile signal is used by one or more usage channels other than the used channel and at least one usage channel ID of a channel that uses the tactile signal of the used channel.

2. The decoding apparatus according to claim 1, wherein the decoding unit is configured to decode the tactile coded data having been subjected to encoding of compressing an information amount using phantom sensation.

3. The decoding apparatus according to claim 2, wherein the tactile coded data includes usage channel designation information for designating a usage channel from among three or more channels of tactile signals, and
the decoding unit is configured to output a tactile signal of a channel indicated by the usage channel designation information.

4. The decoding apparatus according to claim 1, wherein the decoding unit is configured to decode the tactile coded data having been subjected to encoding of compressing an information amount using an apparent movement.

5. The decoding apparatus according to claim 4, wherein the tactile coded data includes usage presence/absence information indicating usage presence/absence of an apparent movement, and
the decoding unit is configured to decode the tactile coded data on a basis of the usage presence/absence information.

6. The decoding apparatus according to claim 5, wherein the tactile coded data includes a tactile signal of only a single channel among usable channels being channels of tactile signals that can use an apparent movement, and output control information indicating an output channel and an output timing of the tactile signal, and the decoding unit is configured to output the tactile signal of the single channel in accordance with the output control information.

7. The decoding apparatus according to claim 6, wherein the single channel is a channel with an earliest signal rising timing among signals of the usable channels.

8. The decoding apparatus according to claim 1, wherein the decoding unit is configured to decode the tactile coded data in which a size of a block indicating a processing unit in a time direction is made variable.

9. The decoding apparatus according to claim 1, wherein the tactile signal is a signal that is based on a detection signal of a tactile sensor.

10. The decoding apparatus according to claim 1, wherein the tactile signal is a signal that is based on a voice signal.

11. A decoding method executed by processing circuitry, the method comprising:
decoding tactile coded data obtained by performing encoding of compressing an information amount, on a tactile signal using higher-order perception in a tactile sense, wherein the tactile coded data includes header information having a header format comprising a used channel ID of a channel of which the tactile signal is used by one or more usage channels other than the used channel and a usage channel ID of at least one channel that uses the tactile signal of the used channel.

12. A non-transitory computer readable medium storing instructions that, when executed by processing circuitry, perform a decoding method comprising:
decoding tactile coded data obtained by performing encoding of compressing an information amount, on a tactile signal using higher-order perception in a tactile sense, wherein the tactile coded data includes header information having a header format comprising a used channel ID of a channel of which the tactile signal is used by one or more usage channels other than the used channel and at least one usage channel ID of a channel that uses the tactile signal of the used channel.

* * * * *